United States Patent
Asami et al.

(10) Patent No.: US 10,777,283 B2
(45) Date of Patent: Sep. 15, 2020

(54) MEMORY SYSTEM

(71) Applicant: Toshiba Memory Corporation, Minato-ku (JP)

(72) Inventors: Shohei Asami, Fujisawa (JP); Toshikatsu Hida, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/565,625

(22) Filed: Sep. 10, 2019

(65) Prior Publication Data

US 2020/0211654 A1    Jul. 2, 2020

(30) Foreign Application Priority Data

Dec. 27, 2018 (JP) ................. 2018-245035

(51) Int. Cl.
| | | |
|---|---|---|
| G11C 16/04 | (2006.01) | |
| G11C 16/26 | (2006.01) | |
| G11C 16/12 | (2006.01) | |
| G11C 16/08 | (2006.01) | |
| G11C 16/34 | (2006.01) | |

(52) U.S. Cl.
CPC .......... *G11C 16/26* (2013.01); *G11C 16/08* (2013.01); *G11C 16/12* (2013.01); *G11C 16/349* (2013.01)

(58) Field of Classification Search
CPC ......... G11C 16/26; G11C 16/08; G11C 16/12; G11C 16/349
USPC .................................................. 365/185.21
See application file for complete search history.

(56) References Cited

U.S. PATENT DOCUMENTS

| | | | |
|---|---|---|---|
| 7,460,398 B1* | 12/2008 | Roohparvar | G11C 16/12 365/185.03 |
| 7,808,831 B2 | 10/2010 | Mokhlesi et al. | |
| 7,859,932 B2 | 12/2010 | Mokhlesi | |
| 8,773,904 B2 | 7/2014 | Anholt et al. | |
| 9,431,130 B2 | 8/2016 | Sakurada | |
| 2009/0231926 A1* | 9/2009 | Sarin | G11C 11/5642 365/185.21 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0214838 A1 | 8/2010 | Hishida et al. | |

(Continued)

FOREIGN PATENT DOCUMENTS

| | | |
|---|---|---|
| JP | 2013-122804 A | 6/2013 |
| JP | 5444340 B2 | 3/2014 |

(Continued)

*Primary Examiner* — Vu A Le
(74) *Attorney, Agent, or Firm* — Oblon, McClelland, Maier & Neustadt, L.L.P.

(57) ABSTRACT

A memory system includes a semiconductor memory including memory cells and a memory controller configured to perform a first tracking process to determine a first voltage, and to read data using the first voltage in a read process after the first tracking process. In the first tracking process, the memory controller is configured to read only first, second, and third data respectively using a second, third, and fourth voltage, determine a number of first memory cells based on the first and second data, determine a number of second memory cells based on the second and third data, and determine the first voltage, based on the number of first and second memory cells.

20 Claims, 20 Drawing Sheets

(56) References Cited

U.S. PATENT DOCUMENTS

| | | |
|---|---|---|
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2013/0148436 A1 | 6/2013 | Kurosawa |

FOREIGN PATENT DOCUMENTS

| | | |
|---|---|---|
| JP | 5620973 B2 | 11/2014 |
| JP | 5638537 B2 | 12/2014 |

* cited by examiner

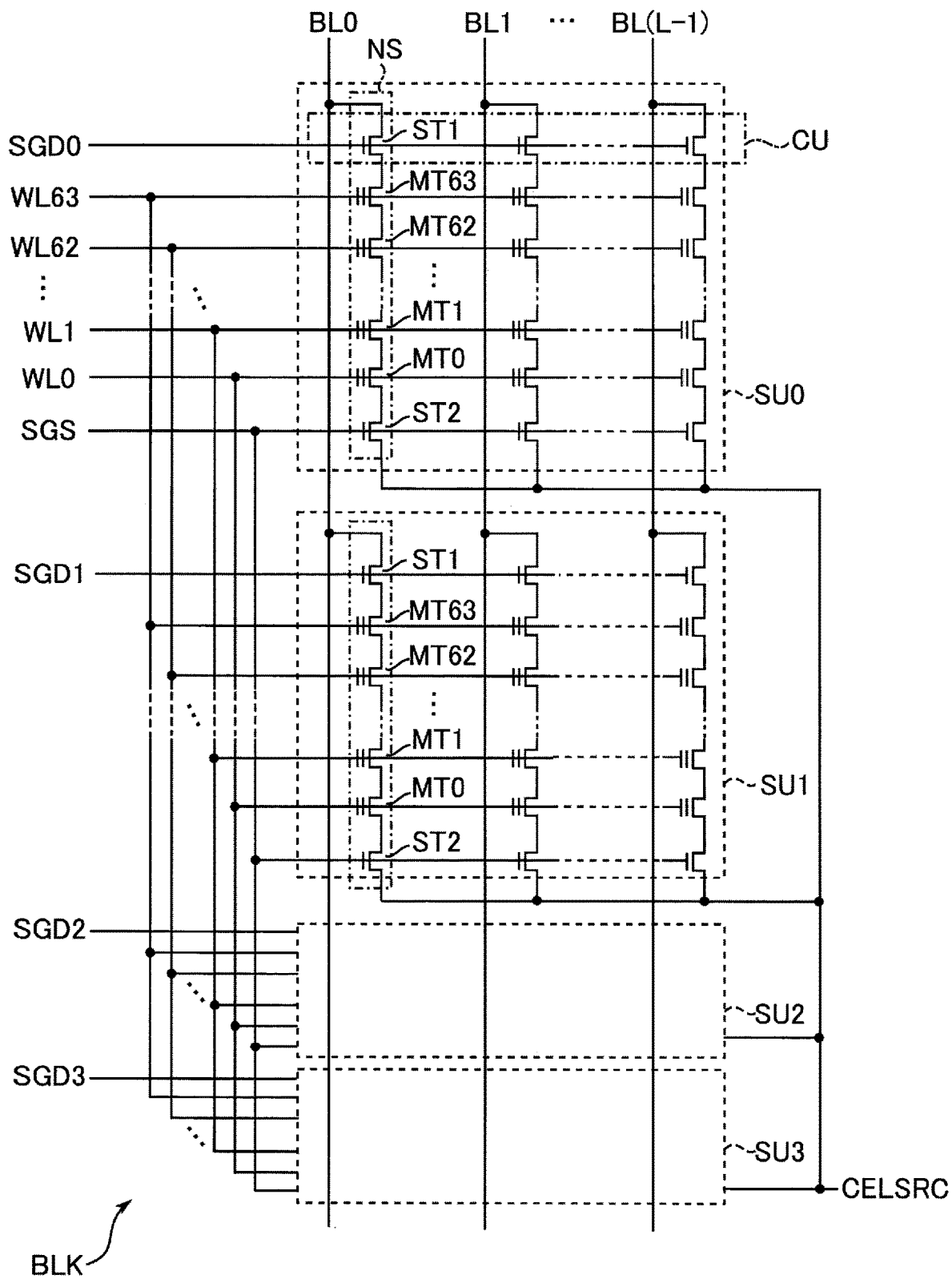
F I G. 2

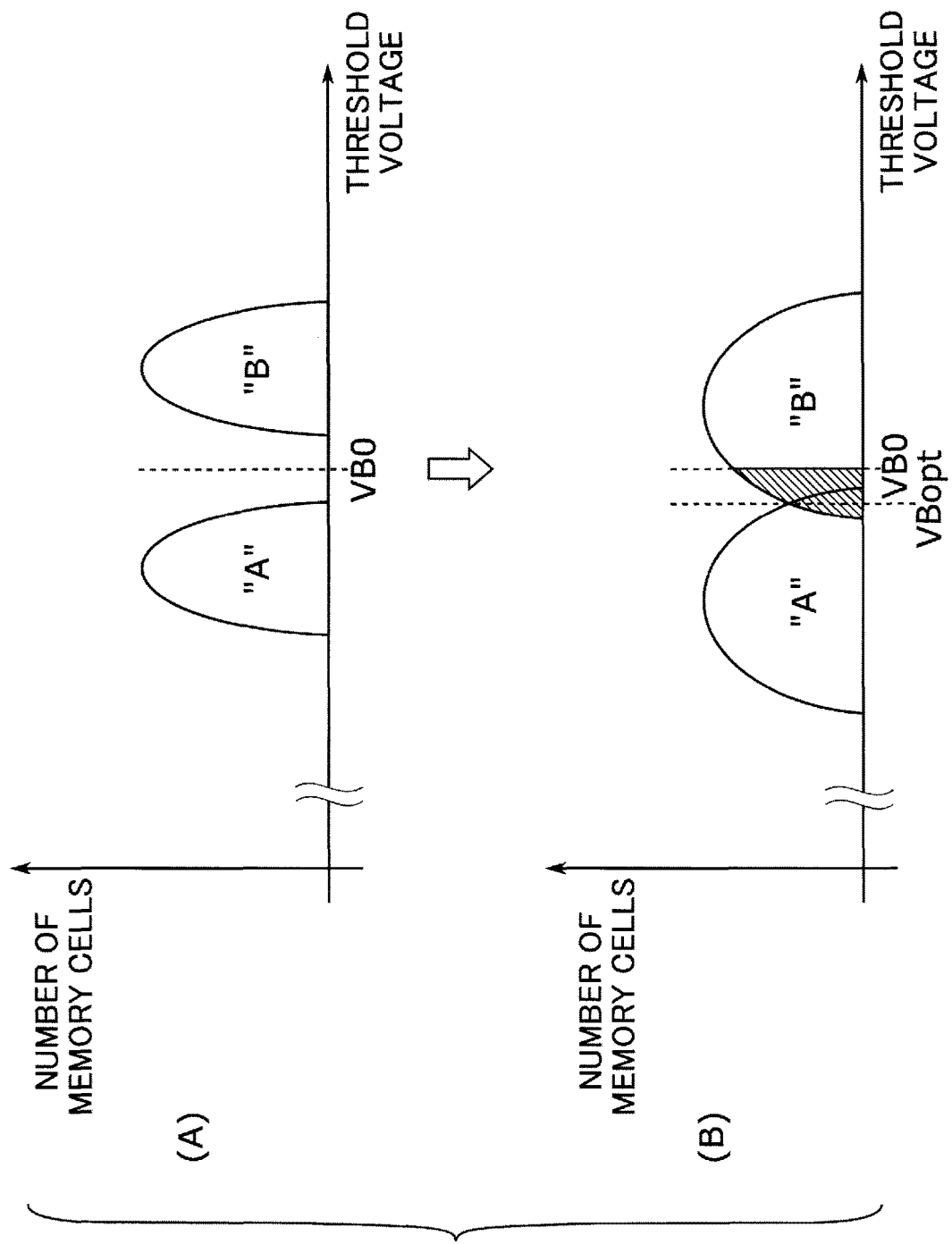
F I G. 5

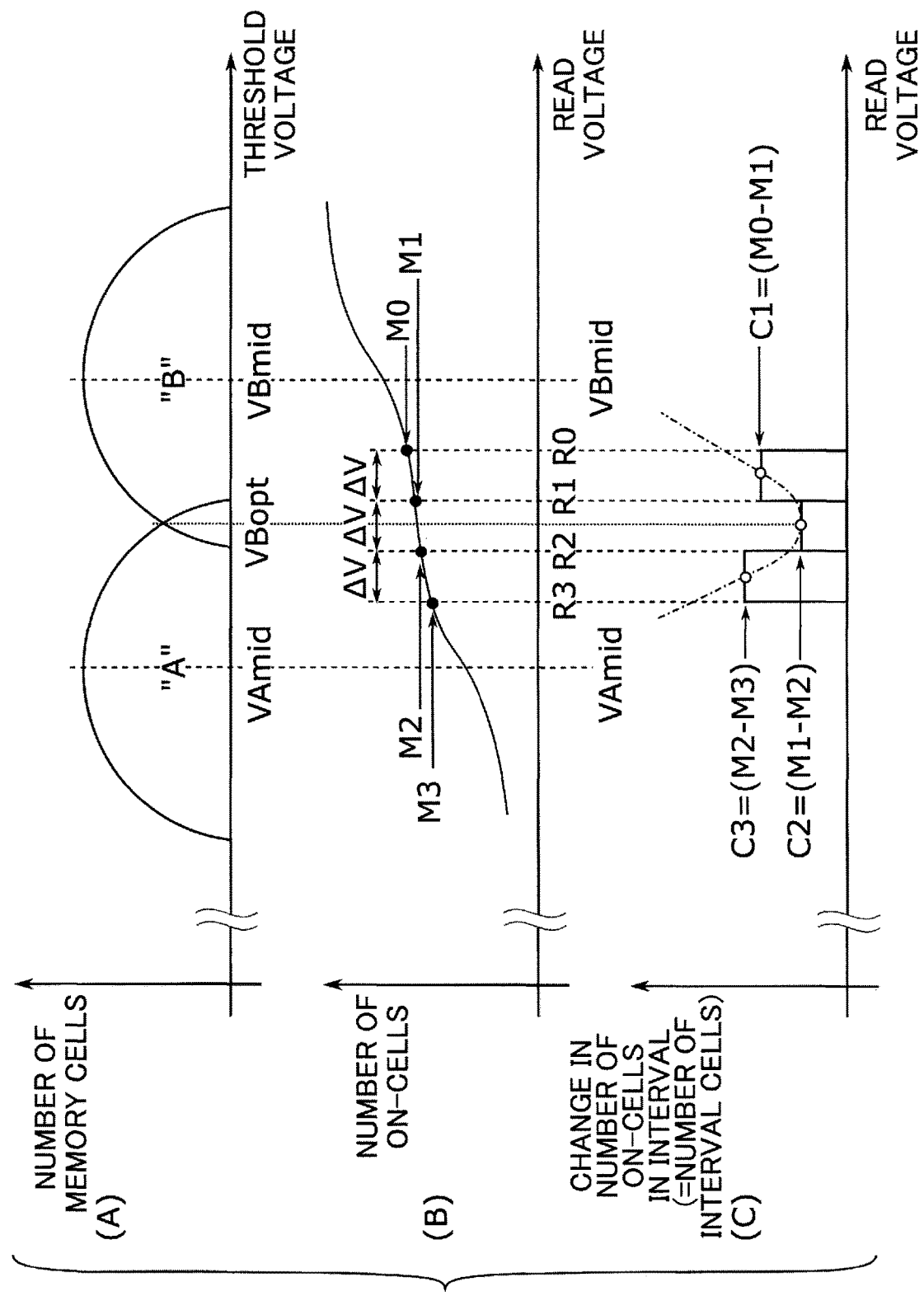
F I G. 6

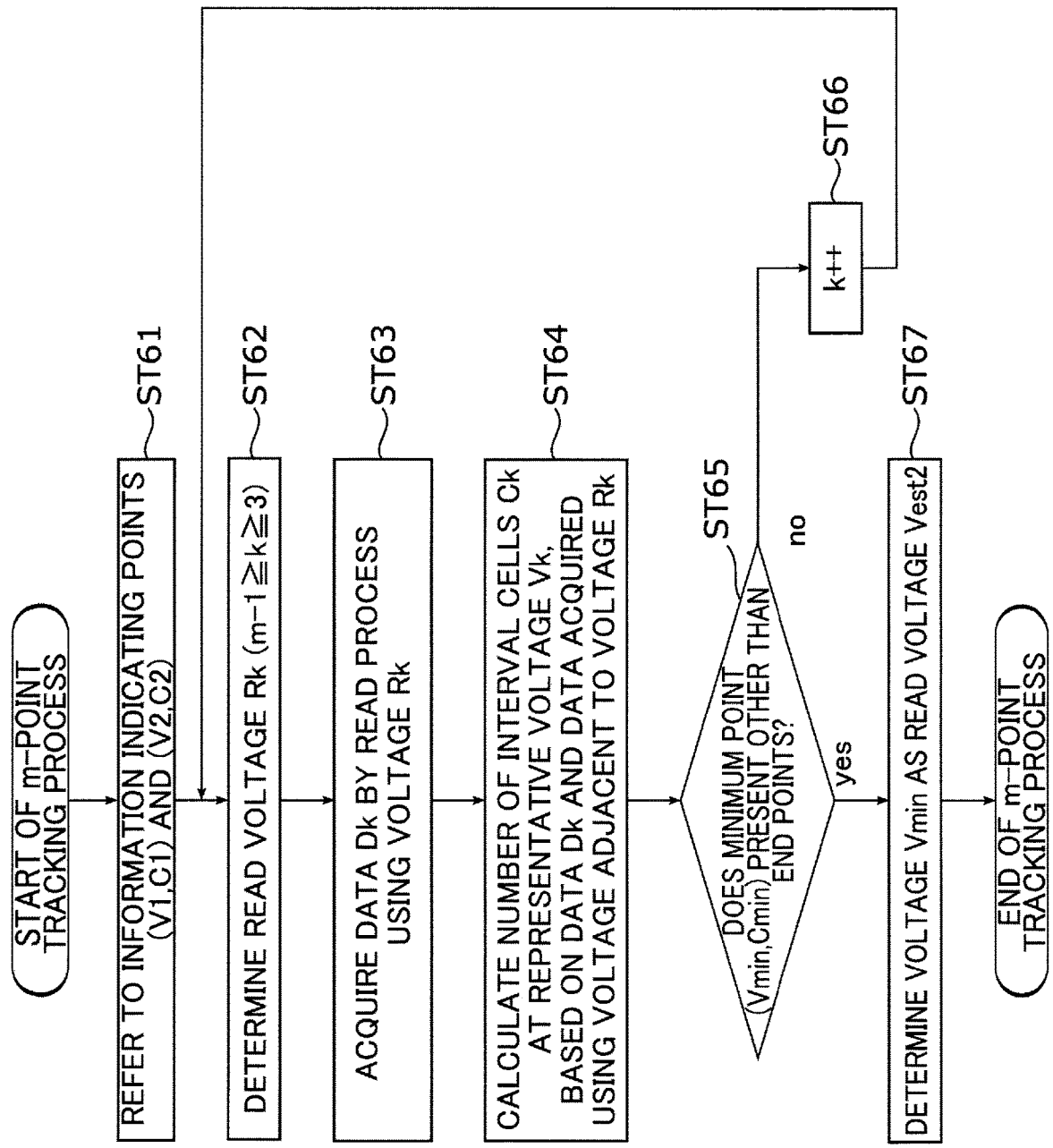
F I G. 10

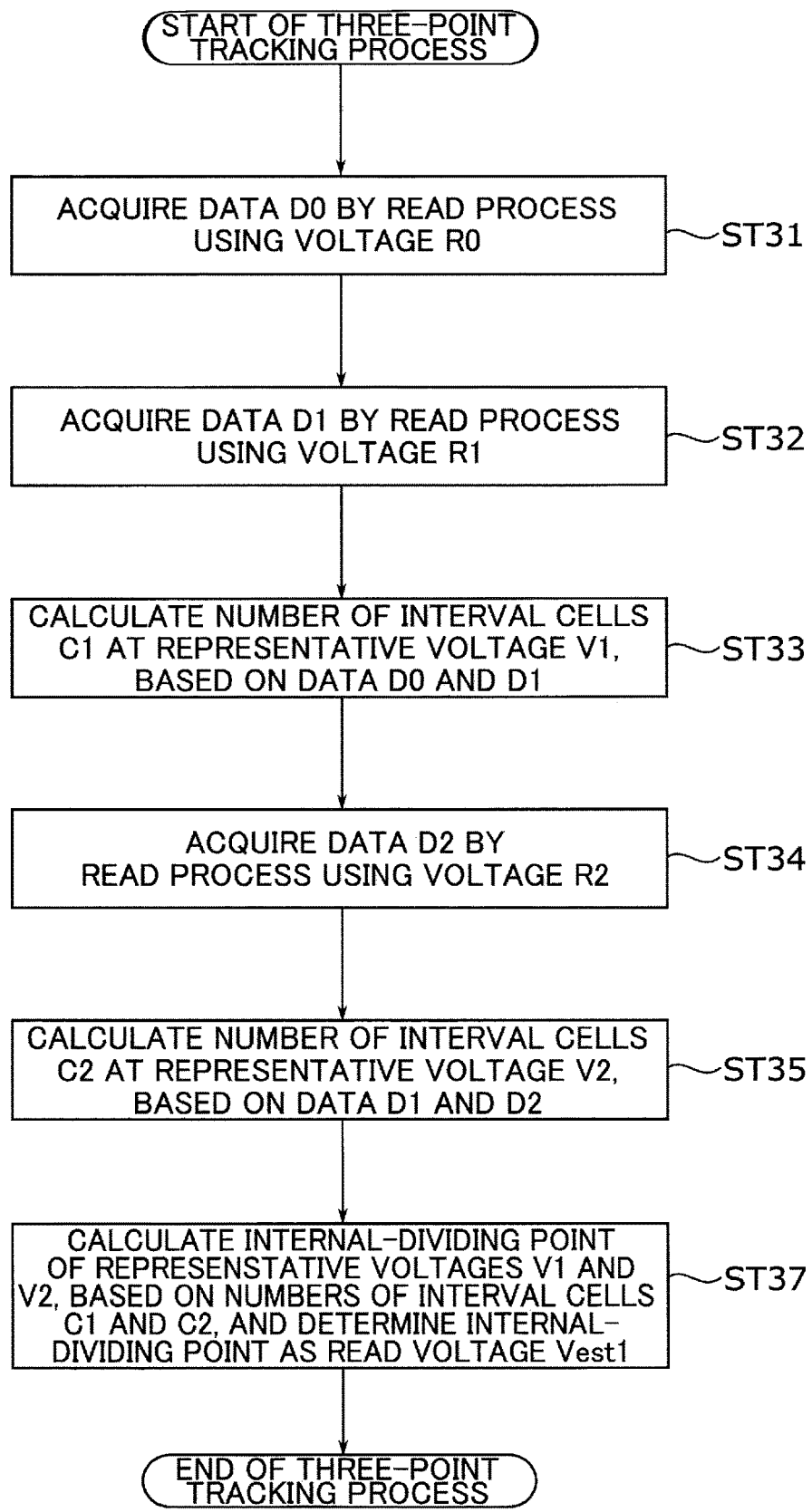
F I G. 14

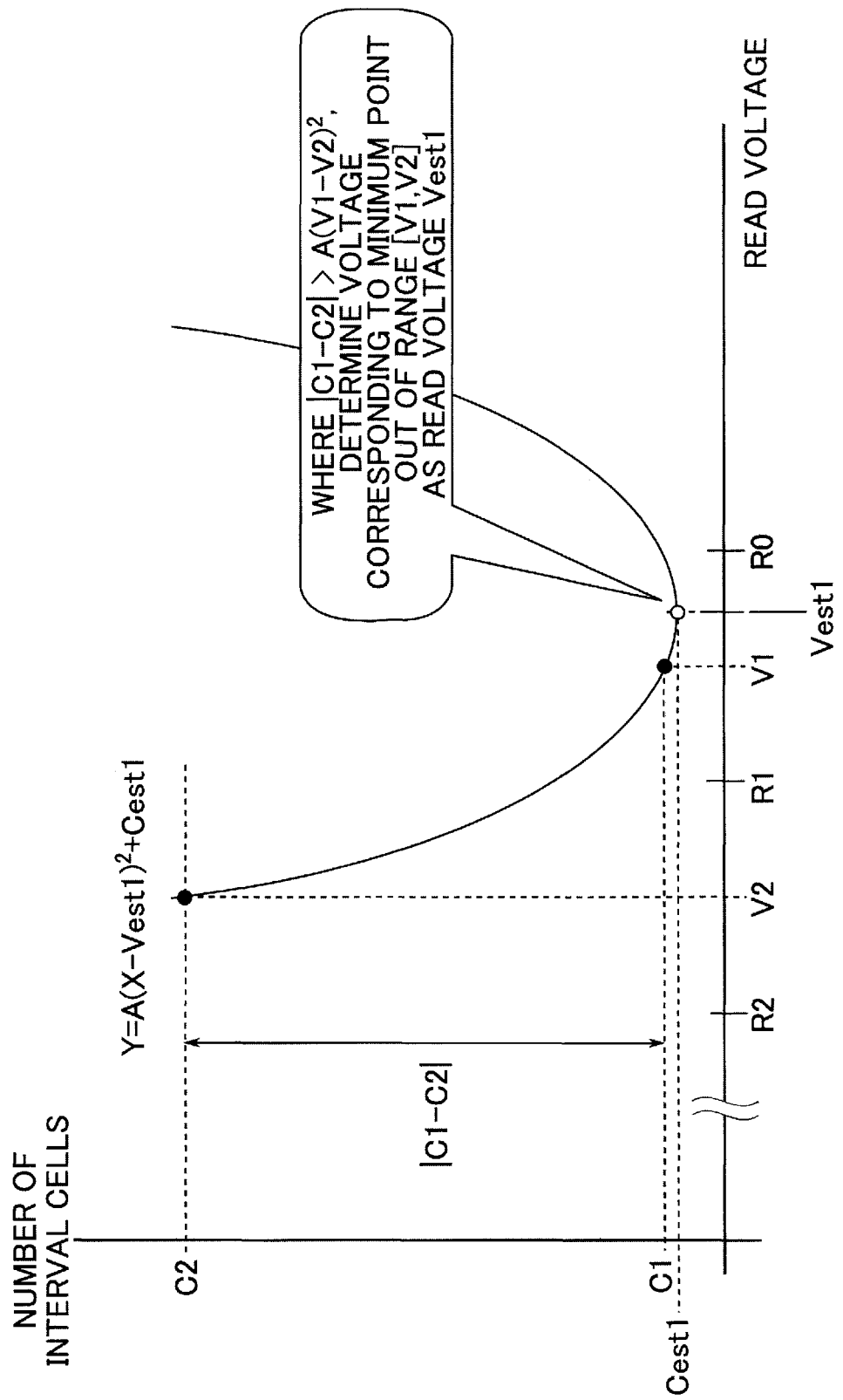
F I G. 18

MEMORY SYSTEM

CROSS-REFERENCE TO RELATED APPLICATIONS

This application is based upon and claims the benefit of priority from Japanese Patent Application No. 2018-245035, filed Dec. 27, 2018, the entire contents of which are incorporated herein by reference.

FIELD

Embodiments described herein relate generally to a memory system.

BACKGROUND

A memory system is known which includes a NAND flash memory serving as a semiconductor memory and a memory controller controlling the NAND flash memory.

BRIEF DESCRIPTION OF THE DRAWINGS

FIG. 2 is a circuit diagram to explain a configuration of a memory cell array according to the first embodiment.

FIG. 5 is a schematic view to explain a variation in the threshold voltage distribution of the memory cell array according to the first embodiment.

FIG. 6 is a schematic view to explain a plurality of the numbers of interval cells calculated by a tracking process performed in the memory system according to the first embodiment.

FIG. 10 is a flowchart to explain an m-point tracking process performed in the memory system according to the first embodiment.

FIG. 14 is a flowchart to explain a three-point tracking process performed in a memory system according to a second embodiment.

FIG. 18 is a schematic diagram to explain the three-point tracking process performed in the memory system according to the third embodiment.

DETAILED DESCRIPTION

In general, according to one embodiment, a memory system includes a semiconductor memory including a plurality of memory cells; and a memory controller configured to perform a first tracking process on the plurality of memory cells to determine a first voltage, and to read data from the plurality of memory cells using the first voltage in a read process after the first tracking process. In the first tracking process, the memory controller is configured to: read only first data, second data and third data from the plurality of memory cells, the first data being read using a second voltage, the second data being read using a third voltage, the third data being read using a fourth voltage; determine a number of first memory cells included among the plurality of memory cells, the first memory cells each having a threshold voltage in a first voltage range, the first voltage range being between the second voltage and the third voltage, based on the first data and the second data; determine a number of second memory cells included among the plurality of memory cells, the second memory cells each having a threshold voltage in a second voltage range, the second voltage range being between the third voltage and the fourth voltage, based on the second data and the third data; and determine the first voltage, based on the number of first memory cells and the number of second memory cells.

Hereinafter, embodiments will be described with reference to the drawings. In the descriptions below, components having the same function and configuration are denoted by a common reference symbol. To distinguish these components, a subscript is added to the symbol. If the components need not to be distinguished, they include only the common reference symbol and not a subscript.

1. First Embodiment

A memory system according to a first embodiment will be described. The memory system according to the first embodiment is an example of a memory system that includes a NAND flash memory as a nonvolatile memory.

1.1 Configuration

A configuration of the memory system according to the first embodiment will be described.

1.1.1 Configuration of Memory System

An overview of the configuration of the memory system according to the first embodiment is initially described with reference to FIG. 1.

Figure 1:
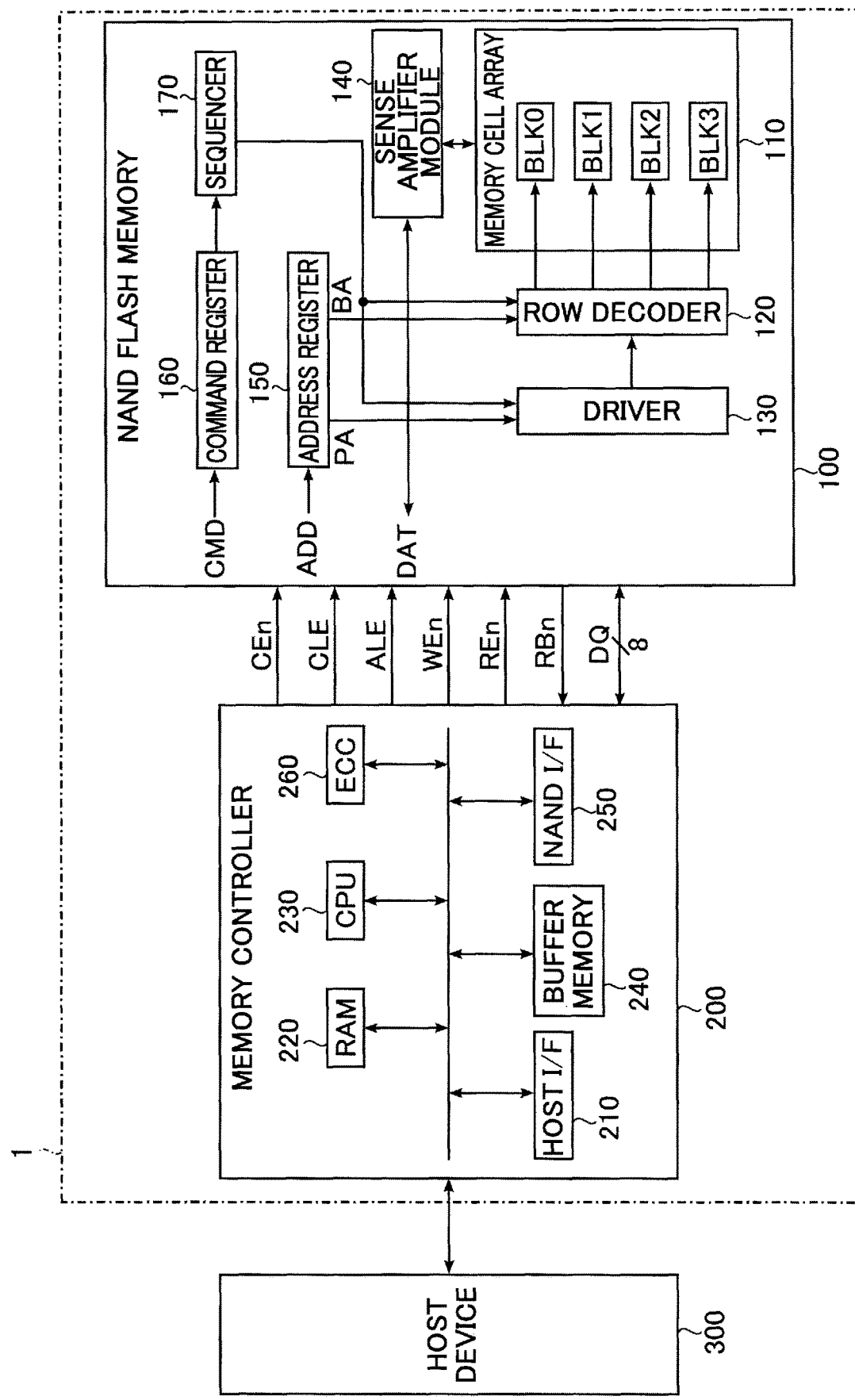
FIG. 1 is a block diagram to explain a configuration of a memory system according to a first embodiment.

As shown in FIG. 1, the memory system 1 includes a nonvolatile memory (NAND flash memory) 100 and a memory controller 200. The NAND flash memory 100 and the memory controller 200 may be, for example, integrated into one semiconductor device. An example of the semiconductor device is a memory card such as an SD™ card, a solid-state drive (SSD). The semiconductor memory 100 is not limited to the NAND flash memory, and a NOR type flash memory may be used instead.

The NAND flash memory 100 includes a plurality of memory cells to store data non-volatilely. The memory controller 200 is connected to the NAND flash memory 100 via a NAND bus and also connected to a host device 300 via a host bus. The memory controller 200 controls the NAND flash memory 100 and accesses the NAND flash memory 100 in response to an instruction from the host device 300. The host device 300 is, for example, a digital camera and a personal computer, and the host bus is a bus that conforms to, for example, an SD™ interface, a serial attached SCSI (small computer system interface) (SAS), a serial ATA (advanced technology attachment) (SATA), or a PCI (peripheral component interconnect) express™ (PCIe) and an NVM (nonvolatile memory) express™ (NVMe). The NAND bus is used to receive and transmit a signal that conforms to a NAND interface.

As examples of NAND interface signals, there are a chip enable signal CEn, a command latch enable signal CLE, an address latch enable signal ALE, a write enable signal WEn, a read enable signal REn, a ready/busy signal RBn and an input/output signal DQ. In the description below, where "n" is added as a suffix to a signal name, the signal in question has a negative logic. That is, "n" indicates that the signal is asserted at an "L (Low)" level.

The signal CEn enables the NAND flash memory 100 and is asserted at the low level. The signals CLE and ALE notify the NAND flash memory 100 that the signal DQ input to the NAND flash memory 100 are a command and an address, respectively. The signal WEn is asserted at the low level and causes the input signal DQ to be fetched into the NAND flash memory 100. The signal REn is asserted at the low level and used to read the output signal DQ from the NAND flash memory 100. The ready/busy signal RBn indicates whether the NAND flash memory 100 is in a ready state (where the NAND flash memory 100 can receive a command from the memory controller 200) or in a busy state (where the NAND flash memory 100 cannot receive a command from the memory controller 200). A low level thereof represents the busy state. The input/output signal DQ is, for example, an 8-bit signal. The input/output signal DQ is an entity of data to be exchanged between the NAND flash memory 100 and the memory controller 200, and a command CMD, an address ADD, and is data DAT such as write data, read data and the like.

1.1.2 Configuration of Memory Controller

A configuration of the memory controller 200 will be described in detail.

The memory controller 200 is, for example, a system-on-a-chip (SoC) and includes a host interface circuit 210, a memory (RAM) 220, a processor (CPU) 230, a buffer memory 240, a NAND interface circuit 250 and an ECC circuit 260. The functions of the components 210, 220, 230, 240, 250 and 260 of the memory controller 200 may be carried out by either a hardware configuration or a combination of hardware resources and firmware.

The host interface circuit 210 is connected to the host device 300 via the host bus to transfer requests and data from the host device 300 to the processor 230 and the buffer memory 240, respectively. The host interface circuit 210 also transfers data in the buffer memory 240 to the host device 300 in response to instructions from the processor 230.

The memory 220 is, for example, a semiconductor memory such as a static random access memory (SRAM), and is used as a work space of the processor 230. The memory 220 stores firmware configured to control the NAND flash memory 100, various kinds of management tables, and the like.

The processor 230 controls entire operation of the memory controller 200. For example, upon receipt of a write request from the host device 300, the processor 230 issues a write command to the NAND interface circuit 250. The same holds true for a read process and an erase process. The processor 230 also executes various processes to control the NAND flash memory 100. For example, the processor 230 may execute a read process as an internal process associated with a tracking process described later. The read process is executed in a background of the tracking process.

The buffer memory 240 is, for example, a dynamic random access memory (DRAM), and temporarily stores write data or read data.

The NAND interface circuit 250 is connected to the NAND flash memory 100 via the NAND bus and serves to communicate with the NAND flash memory 100. Upon receipt of a command from the processor 230, the NAND interface circuit 250 outputs the signals CEn, ALE, CLE, WEn and REn to the NAND flash memory 100. During write processing, the write command issued from the processor 230 and write data in the buffer memory 240 are transferred to the NAND flash memory 100 as the input/output signal DQ. During read processing, a read command issued from the processor 230 is transferred to the NAND flash memory 100 as the input/output signal DQ, and data read out of the NAND flash memory 100 is received as the input/output signal DQ and transferred to the buffer memory 240.

The ECC circuit 260 executes an error detection process and an error correction process for data stored in the NAND flash memory 100. More specifically, during the data write processing, the ECC circuit 260 generates an error correction code and provides it for the write data, and during the data read processing, it decodes the error correction code and detects the presence or absence of error bits. When the ECC circuit 260 detects error bits, it specifies a location of the error bit and corrects the error. An error correction method includes, for example, a hard bit decoding and a soft bit decoding. As hard bit decoding codes for use in the hard bit decoding, for example, a Bose-Chaudhuri-Hocquenghem (BCH) code and a Reed-Solomon (RS) code can be used. As soft bit decoding codes for use in the soft bit decoding, for example, a Low Density Parity Check (LDPC) code can be used.

1.1.3 Configuration of NAND Flash Memory

A configuration of the NAND flash memory 100 will be described. As shown in FIG. 1, the NAND flash memory 100 includes a memory cell array 110, a row decoder 120, a driver 130, a sense amplifier module 140, an address register 150, a command register 160, and a sequencer 170.

The memory cell array 110 includes a plurality of blocks BLK each including a plurality of nonvolatile memory cells associated with rows and columns. In FIG. 1, four blocks BLK0 to BLK3 are shown as one example. The memory cell array 110 stores data supplied from the memory controller 200.

The row decoder 120 selects one of the blocks BLK0 to BLK3 based upon a block address BA in the address register 150 and also selects a word line in the selected block BLK.

The driver 130 applies a voltage to the selected block BLK through the row decoder 120, based on the page address PA stored in the address register 150.

During the data read process, the sense amplifier module 140 senses the threshold voltage of a memory cell transistor in the memory cell array 110 to read data DAT. Then, the sense amplifier module 140 outputs this read data DAT to the memory controller 200. During the data write process, the sense amplifier module 140 transfers write data DAT received from the memory controller 200 to the memory cell array 110.

The address register 150 stores an address ADD received from the memory controller 200. The address ADD includes the foregoing block address BA and page address PA. The command register 160 stores a command CMD received from the memory controller 200.

The sequencer 170 controls entire operation of the NAND flash memory 100 based on the command CMD stored in the command register 160.

The configuration of the block BLK will be described with reference to FIG. 2, which is a circuit diagram of one block BLK.

As shown in FIG. 2, the block BLK includes, for example, four string units SU (SU0 to SU3). Each of the string units SU includes a plurality of NAND strings NS. The number of blocks in the memory cell array 110 is optional, as is the number of string units in the block BLK.

Each of the NAND strings NS includes, for example, 64 memory cell transistors MT (MT0 to MT63) and selection transistors ST1 and ST2. Each of the memory cell transistors MT includes a control gate and a charge storage layer to store data non-volatilely. The memory cell transistors MT are connected in series between the source of the selection transistor ST1 and the drain of the selection transistor ST2.

The gates of select transistors ST1 included in NAND strings NS of the string units SU0 to SU3 are connected to select gate lines SGD0 to SGD3, respectively. The gates of select transistors ST2 included in the NAND strings NS of the string units SU0 to SU3 are commonly connected to, for example, select gate line SGS. Alternatively, the gates of select transistors ST2 included in the NAND strings NS of the string units SU0 to SU3 may be connected to different select gate lines SGS0 to SGS3 of the string units. The control gates of the memory cell transistors MT0 to MT63 included in the NAND strings NS of the same block BLK are connected to word lines WL0 to WL63, respectively.

The drains of select transistors ST1 of the NAND strings NS of the same column included in the blocks of the memory cell array 110 are commonly connected to a bit line BL (one of BL0 to BL(L−1), where L is a natural number of 2 or more). That is, the bit line BL commonly connects the NAND strings NS of the same column of a plurality of blocks BLK. The sources of select transistors ST2 are commonly connected to a source line CELSRC.

In other words, each of the string units SU is a set of NAND strings NS connected to different bit lines BL and connected to the same select gate line SGD. Of the string units SU, a set of memory cell transistors MT connected in common to the same word line WL is also referred to as a cell unit CU (or memory cell group). Each of the blocks BLK is a set of string units SU having word lines WL in common. The memory cell array 110 is a set of blocks BLK having bit lines BL in common.

Figure 3:
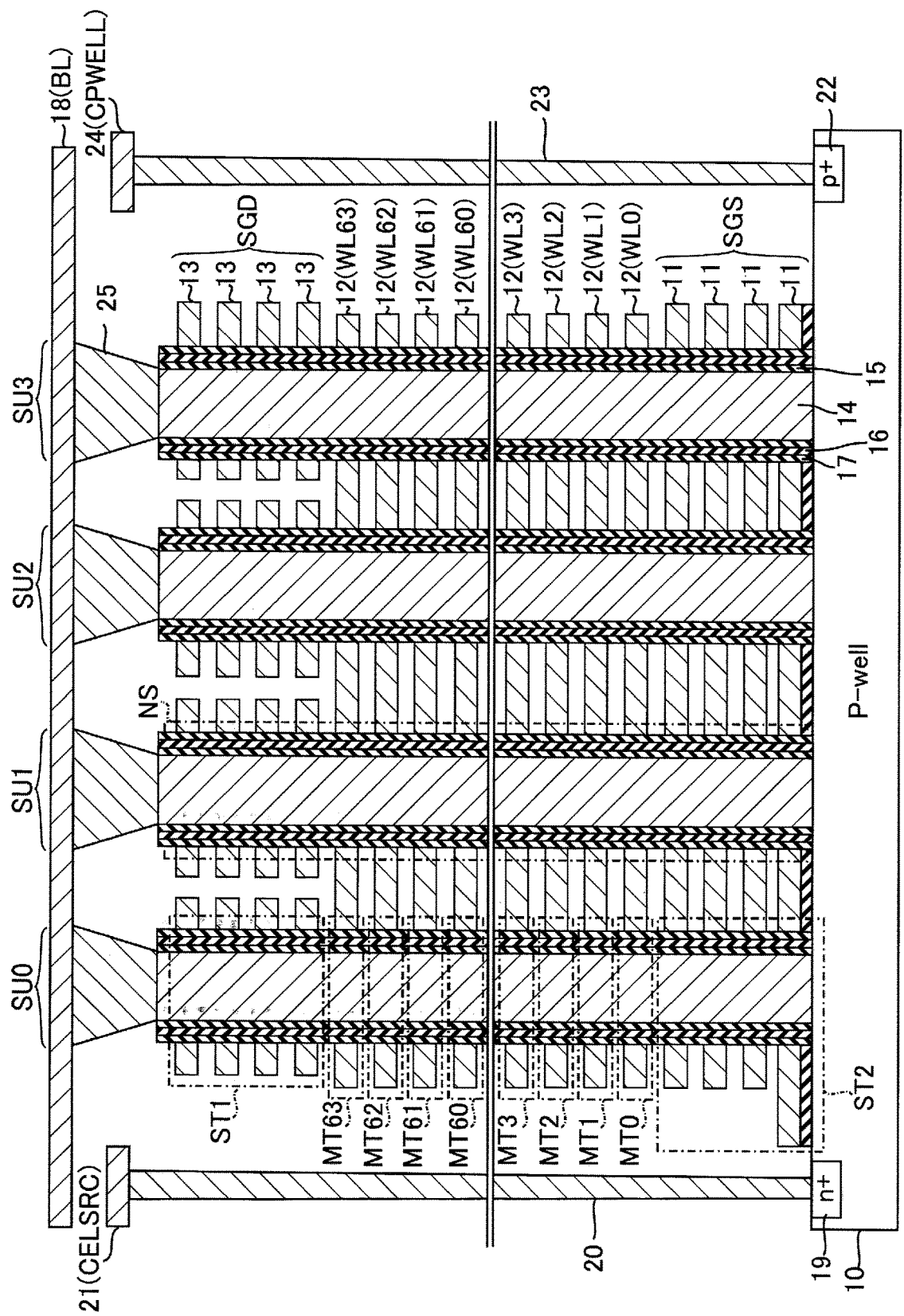
FIG. 3 is a sectional view to explain the configuration of the memory cell array according to the first embodiment.

FIG. 3 is a sectional view of a partial region of a block BLK. As shown in FIG. 3, a plurality of NAND strings NS are formed above a p-type well region 10. To be more specific, four interconnect layers 11 functioning as select gate lines SGS, sixty-four interconnect layers 12 functioning as word lines WL0 to WL63, and, for example, four interconnect layers 13 functioning as select gate lines SGD are stacked in order above the p-type well region 10. Insulating films (not shown) are formed between the stacked interconnect layers.

Pillar-shaped conductors 14 passing through the interconnect layers 13, 12, and 11 and reaching the p-type well region 10 are formed. A gate insulating film 15, a charge accumulation layer (insulating film or conductive film) 16, and a block insulating film 17 are formed in order on the side surface of each of the conductors 14. With these, the memory cell transistors MT and the select transistors ST1 and ST2 are formed. Each conductor 14 is a region which functions as a current path of the NAND string NS and in which the channels of the transistors are formed. A metal interconnect layer 18 functioning as the bit line BL is disposed above the conductors 14. Each of the conductors 14 and the metal interconnect layer 18 are connected, for example, via corresponding contact plug 25.

In the surface region of the p-type well region 10, an $n^+$-type impurity diffusion layer 19 is formed. On the $n^+$-type impurity diffusion layer 19, a contact plug 20 is formed, and the contact plug 20 is connected to a metal interconnect layer 21 that functions as a source line SL. In the surface region of the p-type well region 10, a $p^+$-type impurity diffusion layer 22 is also formed. On the $p^+$-type impurity diffusion layer 22, a contact plug 23 is formed, and the contact plug 23 is connected to a metal interconnect layer 24 that functions as well interconnect CPWELL. The well interconnect CPWELL is interconnect to apply a voltage to the conductor 14 via the p-type well region 10.

A plurality of configurations corresponding to the above are arranged in a depth direction of a sheet of FIG. 3. A set of a plurality of NAND strings NS arranged in the depth direction is one string unit SU.

In the first embodiment, one memory cell transistor MT can store, for example, data of three bits. The three bits are called a lower bit, a middle bit and an upper bit in sequence from the lower bit. A set of lower bits stored in the memory cells belonging to the same cell unit CU is called a lower page, a set of middle bits stored therein is called a middle page, and a set of upper bits stored therein is called an upper page. In other words, three pages are assigned to one single word line WL (i.e., one cell unit CU) in one string unit SU and thus the string unit SU including 64 word lines WL has a capacity of 192 pages. Alternatively, the "page" can also be defined as part of memory space formed in the cell unit CU. Data can be written or read per each page or per each cell unit CU, whereas data is erased per each block BLK.

Figure 4:
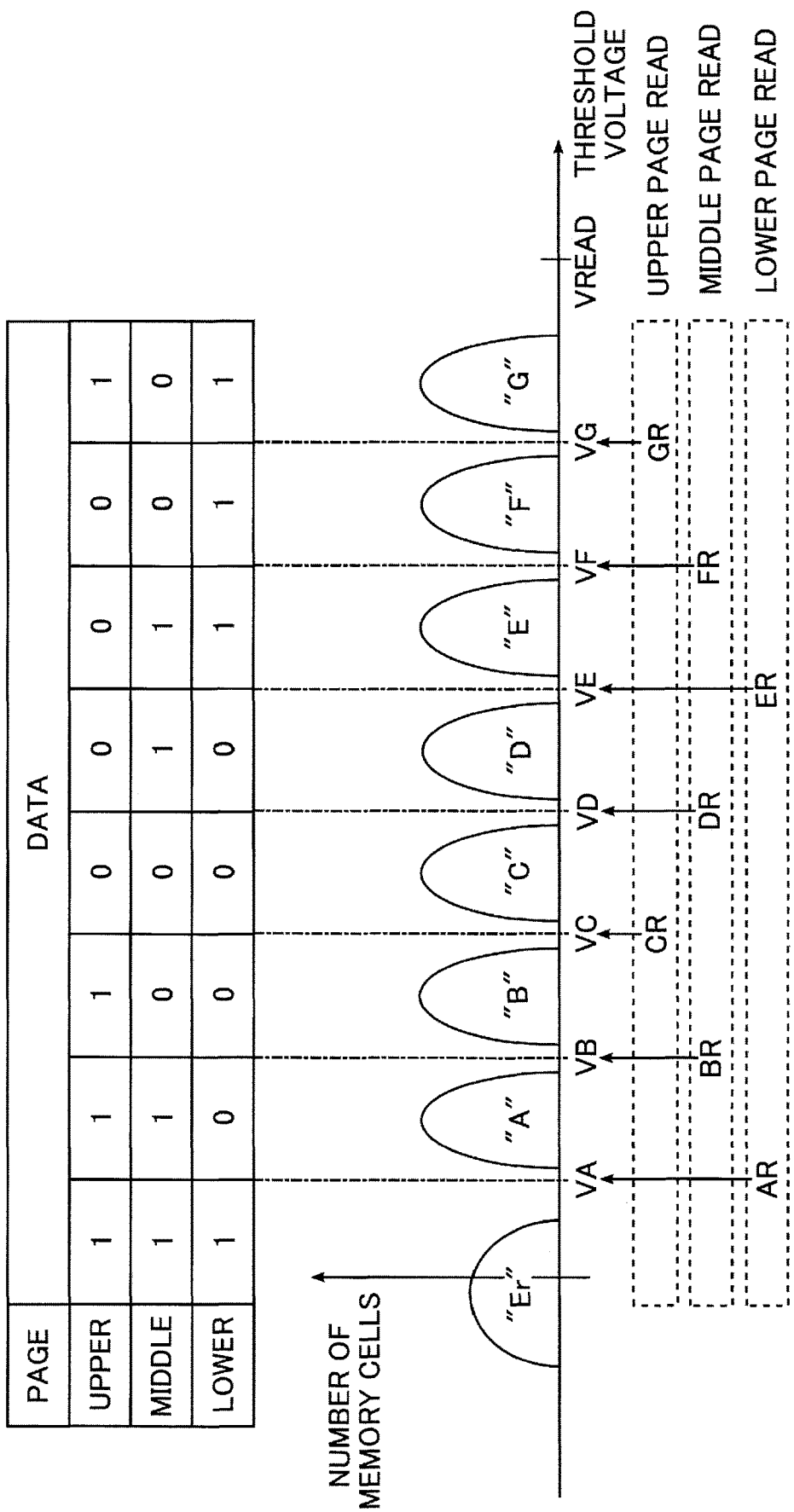
FIG. 4 is a schematic view to explain a threshold voltage distribution of the memory cell array according to the first embodiment.

FIG. 4 is a diagram illustrating data that can be stored in each memory cell transistor MT of the memory cell array, a threshold voltage distribution, and voltages used during read process and write process.

As described above, each memory cell transistor MT can store 3-bit data. In other words, eight states are assigned according to threshold voltages in each memory cell transistor MT. These eight states will be referred to as an "Er" state, an "A" state, a "B" state, a "C" state, . . . , and a "G" state in ascending order of the threshold voltages.

The threshold voltage of a memory cell transistor MT in the "Er" state is lower than a voltage VA and corresponds to a data erased state. The threshold voltage of a memory cell transistor MT in the "A" state is not lower than the voltage VA and lower than a voltage VB (>VA). The threshold voltage of a memory cell transistor MT in the "B" state is not lower than the voltage VB and lower than a voltage VC (>VB). The threshold voltage of a memory cell transistor MT in the "C" state is not lower than the voltage VC and lower than a voltage VD (>VC). The threshold voltage of a memory cell transistor MT in the "D" state is not lower than the voltage VD and lower than a voltage VE (>VD). The threshold voltage of a memory cell transistor MT in the "E" state is not lower than the voltage VE and lower than a voltage VF (>VE). The threshold voltage of a memory cell transistor MT in the "F" state is not lower than the voltage VF and lower than a voltage VG (>VF). The threshold voltage of a memory cell transistor MT in the "G" state is not lower than the voltage VG and lower than a voltage VREAD (>VG). Among the eight states distributed in this way, the "G" state is the state of the highest threshold voltage. The voltages VA to VG are collectively referred to as "read voltage VCGR" or simply as "read voltage". The voltage VREAD is, for example, a voltage applied to the word line WL that is not a read target in the read operation, and is a voltage that turns on the memory cell transistor MT regardless of data held therein. That is, the voltage VREAD is higher than the read voltage VCGR.

The threshold voltage distribution described above is achieved by data of three bits (three pages) of the lower bit, middle bit, and upper bit. That is, the relationship between the "Er" state to the "G" state and the lower bit, middle bit and upper bit is as follows:

"Er" state: "111"(in the order of "the upper bit, middle bit; and lower bit")
"A" state: "110"
"B" state: "100"
"C" state: "000"
"D" state: "010"
"E" state: "011"
"F" state: "001"
"G" state: "101"

As can be seen from this, only one of the three bits changes between the data corresponding to the two states adjacent in the threshold voltage distribution.

When a lower bit is read, a voltage corresponding to the boundary at which the value ("0" or "1") of the lower bit changes may be used, and the same applies to the middle bit and the upper bit as well.

As shown in FIG. 4, in reading of the lower page, the voltage VA that distinguishes the "Er" state from the "A" state, and the voltage VE that distinguishes the "D" state from the "E" state are used as read voltages. Read operations using the voltages VA and VE will be referred to as read operations AR and ER, respectively.

In the read operation AR, it is determined whether the threshold voltage for the memory cell transistor MT is lower than the voltage VA. That is, the memory cell transistor MT in the erased state is specified by the read operation AR. In the read operation ER, it is determined whether the threshold voltage for the memory cell transistor MT is lower than the voltage VE.

In reading of the middle page, the voltage VB that distinguishes the "A" state from the "B" state, the voltage VD that distinguishes the "C" state from the "D" state, and the voltage VF that distinguishes the "E" state from the "F" state are used as read voltages. Read operations using the voltages VB, VD and VF will be referred to as read operations BR, DR and FR, respectively.

In the read operation BR, it is determined whether the threshold voltage for the memory cell transistor MT is lower than the voltage VB. In the read operation DR, it is determined whether the threshold voltage for the memory cell transistor MT is lower than the voltage VD. In the read operation FR, it is determined whether the threshold voltage for the memory cell transistor MT is lower than the voltage VF.

In reading of the upper page, the voltage VC that distinguishes the "B" state from the "C" state, and the voltage VG that distinguishes the "F" state from the "G" state are used as read voltages. Read operations using voltages VC and VG will be referred to as read operations CR and GR, respectively.

In the read operation CR, it is determined whether the threshold voltage for the memory cell transistor MT is lower than the voltage VC. In the read operation GR, it is determined whether the threshold voltage for the memory cell transistor MT is lower than the voltage VG.

Note that data may be erased in a unit of one block BLK or in a unit smaller than the block BLK. An erasing method is described, for example, in U.S. patent application Ser. No. 13/235,389 titled "NONVOLATILE SEMICONDUCTOR MEMORY DEVICE" and filed on Sep. 18, 2011. An erasing method is also described, for example, in U.S. patent application Ser. No. 12/694,690 titled "NON-VOLATILE SEMICONDUCTOR STORAGE DEVICE" and filed on Jan. 27, 2010. An erasing method is further described, for example, in U.S. patent application Ser. No. 13/483,610 titled "NON-VOLATILE SEMICONDUCTOR MEMORY DEVICE AND DATA ERASE METHOD THEREOF" and filed on May 30, 2012. The entire contents of these applications are incorporated herein by reference.

The memory cell array 110 may have a configuration different from that described above. That is, a configuration of the memory cell array 110 may be the one described, for example, in, U.S. patent application Ser. No. 12/407,403 titled "THREE DIMENSIONAL STACKED NONVOLATILE SEMICONDUCTOR MEMORY" and filed on Mar. 19, 2009. Configurations are also described in U.S. patent application Ser. No. 12/406,524 titled "THREE DIMENSIONAL STACKED NONVOLATILE SEMICONDUCTOR MEMORY" and filed on Mar. 18, 2009, U.S. patent application Ser. No. 12/679,991 titled "NON-VOLATILE SEMICONDUCTOR STORAGE DEVICE AND METHOD OF MANUFACTURING THE SAME" and filed on Mar. 25, 2010, and U.S. patent application Ser. No. 12/532,030 titled "SEMICONDUCTOR MEMORY AND METHOD FOR MANUFACTURING SAME" and filed on Mar. 23, 2009. The entire contents of these applications are incorporated herein by reference.

1.2 Operation

Next, an operation in the memory system according to the first embodiment will be described.

1.2.1 Outline of Tracking Processing

The outline of a tracking process according to the first embodiment will be described.

In FIG. 4 referred to in the above, the threshold voltage distributions belonging to each of states in a certain cell unit CU are separated from each other. Therefore, in the read process using the read voltage VCGR, correct data can be read as long as the read voltage VCGR is set between the threshold voltage distributions corresponding to adjacent two states.

However, due to various factors, the threshold voltage may fluctuate. As a result, in the threshold voltage distributions shown in FIG. 4, adjacent distributions may overlap with each other, due to spread of a distribution or a shift of the distribution. This state is shown in FIG. 5.

FIG. 5 is a schematic view illustrating a variation in the threshold voltage distribution of the memory cell array of the first embodiment. As an example, it is assumed that the threshold voltage distribution belonging to the "A" state and the threshold voltage distribution belonging to the "B" state are as shown in FIG. 5A immediately after data is written. With a lapse of time, however, a threshold voltage distribution may shift to the low voltage side or the high voltage side due to interference with its adjacent cell (this phenomenon is called a "data retention error"). In addition, the threshold voltage distribution may also vary when write process or read process is performed for other memory cell transistors MT (this phenomenon is called "disturbance"). Let us assume that the distribution of threshold voltages fluctuates as shown in FIG. 5B, due to such factors as data retention error or disturbance. In this case, if read process is performed with the initially set read voltage VB0, the read data of the memory cell transistors MT corresponding to the shaded portion results in an error. If the number of error bits exceeds the number of correctable error bits of the ECC circuit 260, the data cannot be corrected accurately.

In such a case, it is desirable to set a new read voltage that enables reduction of the overlap between the threshold voltage distributions of the two states, so as to reduce the number of error bits. In order to minimize the number of error bits in the read data, the voltage that minimizes the overlap between the threshold voltage distributions of the two states (that is, a valley position of the threshold voltage distributions of the two states) should be preferably set as a read voltage (for example, a voltage VBopt shown in FIG. 5B should be preferably set). The tracking process is one of the processes for searching for and determining such an optimum read voltage. In the description below, "the position of a voltage" can be read as "the value of a voltage", and "the position at which the overlap between the threshold voltage distributions of states is minimized" can be read as "the voltage that minimizes the overlap between the threshold voltage distributions of states".

FIG. 6 is a schematic view illustrating the number of on-cells in an interval calculated by the tracking process performed in the memory system of the first embodiment. In FIG. 6A, the threshold voltage distribution belonging to the "A" state of a certain cell unit CU and the threshold voltage distribution belonging to the "B" state of the same cell unit are shown as an example. In FIG. 6B, a change of the number of memory cells that are turned on (also referred to as the "number of on-cells" M) in response to a read voltage R is shown. In FIG. 6C, a difference of the number of on-cells (also referred to as the "number of on-cells in the interval" C) between two read voltages is shown. FIGS. 6B and 6C are plotted for the cell unit CU having the threshold voltage distributions shown in FIG. 6A.

As shown in FIG. 6B, when the read voltage is lowered, the number of on-cells rapidly decreases at a voltage slightly higher than a voltage VBmid, which is a mode value of the "B" state, and |dM/dR| becomes a local maximum. The mode value corresponds to a voltage at which the distribution probability of the threshold voltage is highest in FIG. 6A. M is the number of on-cells and R is a read voltage. As the read voltage is further lowered, the decrease rate of the number of on-cells decreases, and the decrease rate of the number of on-cells becomes a local minimum at a certain read voltage. The local minimum value of the decrease rate of the number of on-cells becomes zero if the threshold voltage distribution belonging to the "A" state and the threshold voltage distribution belonging to the "B" state do not overlap. In contrast, if the threshold voltage distribution belonging to the "A" state and the threshold voltage distribution belonging to the "B" state overlap each other, the local minimum value of the decrease rate of the number of on-cells becomes a value that is not zero (>0). When the read voltage is further lowered, the decrease rate of the number of on-cells increases again, and |dM/dR| becomes a local maximum again at a voltage slightly higher than voltage VAmid, which is a mode value of the "A" state.

Based on the above-described change in the number of on-cells, the read voltage at which the overlap between the threshold voltage distributions of the two states becomes smallest (i.e., the read voltage corresponding to the intersection of the threshold voltage distributions of the two states) can be detected. For example, first, a read process is performed using a read voltage R0. The number of on-cells at this time is assumed to be M0. Next, a read process is performed using a voltage R1 which is lower than the voltage R0 by ΔV. The number of on-cells at this time is assumed to be M1. Thus, the number of memory cell transistors MT that are newly turned off when the read voltage decreases from R0 to R1 is C1 (=M0−M1). That is, the number of memory cells having a threshold voltage between [R0,R1] is C1.

Subsequently, a read process is performed using a voltage R2 which is lower than the voltage R1 by ΔV. The number of on-cells at this time is assumed to be M2. Thus, the number of memory cell transistors MT that are newly turned off when the read voltage decreases from R1 to R2 is C2(=M1−M2). If C1>C2, it is considered that the voltage at which |dM/dR| becomes a local minimum is at least lower than the voltage R1.

Subsequently, a read process is performed using a voltage R3 which is lower than the voltage R2 by ΔV. The number of on-cells at this time is assumed to be M3. Assume that the number of memory cell transistors MT that are newly turned off when the read voltage decreases from R2 to R3 is C3(=M2−M3). If C3>C2, such a histogram as shown in FIG. 6C is obtained.

As a result of the above, the threshold voltage distribution indicated by the alternate long and short dash line in FIG. 6C can be estimated by the amount of change in the number of on-cells in the interval (also referred to as "number of interval cells"), and the position of the read voltage at which the overlap between the threshold voltage distribution belonging to the "A" state and the threshold voltage distribution belonging to the "B" state is smallest (referred to as the "valley position") can be estimated as being between the voltage R1 and the voltage R2. In the description below, for the sake of convenience, the number of interval cells associated with an interval between two voltages is counted as the "number of interval cells at one point".

In the description below, the tracking process is used as a general term of the process in which a position where the overlap of the threshold voltage distributions of adjacent states becomes a minimum is searched for by calculating the numbers of interval cells by applying a plurality of read voltages, and in which a voltage corresponding to a point considered to be close to that position (i.e., a voltage considered to be an optimum read voltage) is determined. As described later, the tracking process is classified, for example, according to the number of read voltages used for searching for one optimum read voltage, and includes a three-point tracking process and an m-point tracking process (m is an integer of 4 or more).

1.2.2 Read Process Accompanied by Tracking Process

Figure 7:
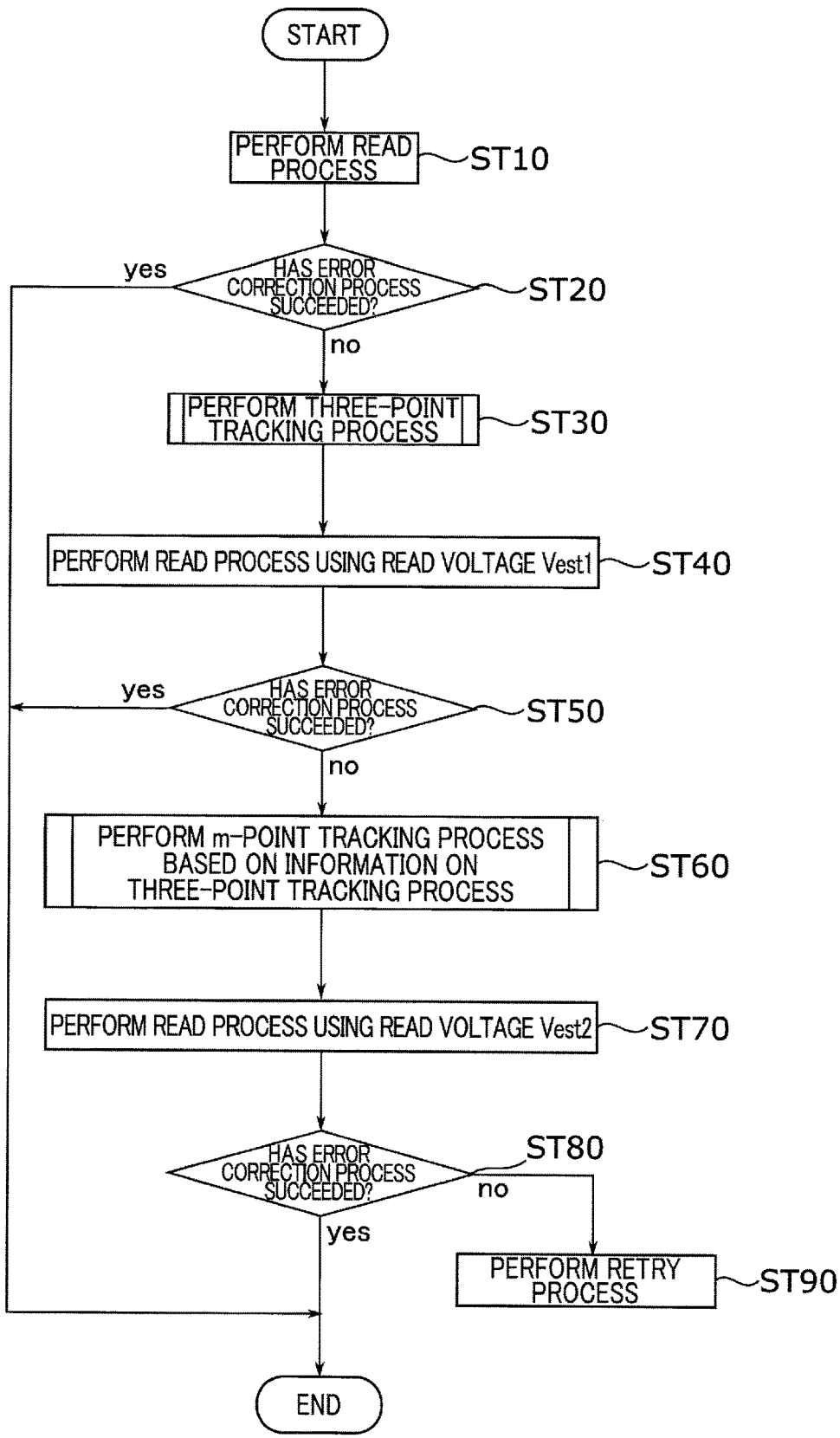
FIG. 7 is a flowchart to explain a read process accompanied by the tracking process performed in the memory system according to the first embodiment.

First, an example of a read process accompanied by a tracking process performed in the memory system of the first embodiment will be described by referring to the flowchart shown in FIG. 7. FIG. 7 shows an example of a flow which is executed when an error correction process for data to be read fails and includes various kinds of tracking processes for searching for a read voltage that enables to correct error for the data to be read.

In step ST10, the memory controller 200 receives a data read request, for example, from the host device 300 and issues a read command indicative of execution of a read process to the NAND flash memory 100. The NAND flash memory 100 sets a read voltage based on information included in the read command, and reads data using the read voltage. The NAND flash memory 100 transmits the read data to the memory controller 200.

In step ST20, the memory controller 200 causes the ECC circuit 260 to execute an error correction process in response to the reception of the read data. If the read data does not contain an error, or if the error can be corrected by the ECC circuit 260 (step ST20; yes), the memory controller 200 transmits the read data to the host device 300 (not shown) without performing a tracking process, and ends the data read process. In contrast, if the number of error bits included in the read data exceeds the number of bits correctable by the ECC circuit 260 and cannot therefore be corrected by the ECC circuit 260 (step ST20; no), the process proceeds to step ST30.

In step ST30, the memory controller 200 starts executing the three-point tracking process. In the three-point tracking process, the memory controller 200 sets three different voltages for one read voltage VCGR, and reads three pieces of read data from the NAND flash memory 100. The memory controller 200 then calculates the numbers of interval cells only at two points, based on the read data. Specifically, in the case of, for example, the read process for the lower page data, the three-point tracking process is performed for each of voltages VA and VE. The memory controller 200 calculates a voltage value Vest1 that is estimated to be in the vicinity of an optimum read voltage, based on the calculated numbers of interval cells at two points, for each of the read voltages at which the three-point tracking process is performed. Details of the three-point tracking process will be described later.

The three-point tracking process does not have to be performed on all read voltages required in reading of the read target page, and may be performed on part of the read voltages.

In step ST40, the memory controller 200 issues, to the NAND flash memory 100, a read command indicating that the read process is to be performed again using the read voltage Vest1 calculated in step ST30. The NAND flash memory 100 reads data from the same read target page as that of step ST10, using the read voltage Vest1. The NAND flash memory 100 transmits the read data to the memory controller 200.

In step ST50, the memory controller 200 causes the ECC circuit 260 to execute an error correction process in response to the reception of the read data. If the read data does not contain an error, or if the error can be corrected by the ECC circuit 260 (step ST50; yes), the memory controller 200 transmits the read data to the host device 300 (not shown) without performing further tracking process, and ends the data read process. In contrast, if the number of error bits included in the read data exceeds the number of bits correctable by the ECC circuit 260 and cannot therefore be corrected by the ECC circuit 260 (step ST50; no), the process proceeds to step ST60.

In step ST60, the memory controller 200 starts execution of the m-point tracking process, using information acquired by the three-point tracking process. In the m-point tracking process, the memory controller 200 reads m pieces of read data using m different read voltages for each of the read voltages VCGR, each of which is required for the read process of the read target page. The memory controller 200 then calculates the numbers of interval cells at (m−1) points, based on the m pieces of read data. Further, the memory controller 200 calculates a voltage value Vest2 that is estimated to be in the vicinity of an optimum read voltage, based on the calculated numbers of interval cells at (m−1) points.

In the m-point tracking process, the memory controller 200 uses the numbers of interval cells at two points calculated in the three-point tracking process in step ST30. That is, in step ST60, the memory controller 200 performs process to calculate the numbers of interval cells at the remaining (m−3) points. Thus, in the m-point tracking process in step ST60, voltage Vest2 is calculated based on the numbers of interval cells at two points that are calculated in step ST30 and the numbers of interval cells at (m−3) points that are further calculated. Details of the m-point tracking process will be described later.

In step ST70, the memory controller 200 issues, to the NAND flash memory 100, a read command indicating that the read process is to be performed again using the read voltage Vest2 calculated in step ST60. The NAND flash memory 100 reads data from the same read target page as that of step ST10, using read voltage Vest2. The NAND flash memory 100 transmits the read data to the memory controller 200.

In step ST80, the memory controller 200 causes the ECC circuit 260 to execute an error correction process in response to the reception of the read data. If the number of error bits included in the read data exceeds the number of bits correctable by the ECC circuit 260 and therefore cannot be corrected by the ECC circuit 260 (step ST80; no), the process proceeds to step ST90. In step ST90, the memory controller 200 subsequently executes a retry process. The retry process may include, for example, detailed tracking process performed using more read voltages, error correction process using a soft decision code.

In contrast, if the read data does not contain an error, or if the error can be corrected by the ECC circuit 260 (step ST80; yes), the memory controller 200 transmits the read data to the host device 300 (not shown) and ends the data read process.

In the above-described manner, the read process accompanied by the tracking process is finished.

1.2.3 Three-Point Tracking Process

Next, the three-point tracking process will be described.

Figure 8:
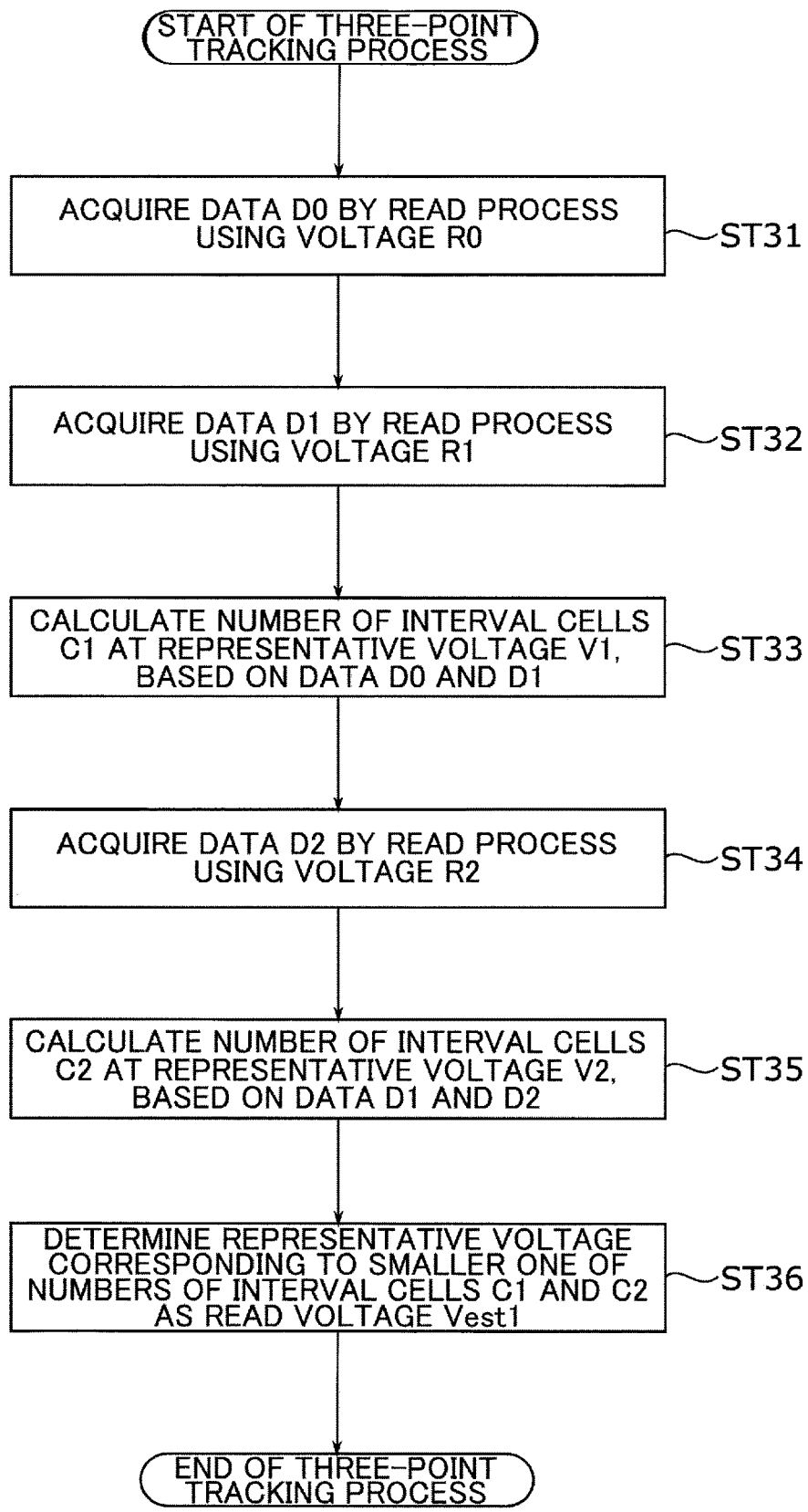
FIG. 8 is a flowchart to explain a three-point tracking process performed in the memory system according to the first embodiment.

FIG. 8 is a flowchart illustrating three-point tracking process performed in the memory system of the first embodiment. Steps ST31 to ST36 shown in FIG. 8 correspond to step ST30 in FIG. 7. For the sake of convenience of description, in FIG. 8, a process for calculating the read voltage Vest1 corresponding to one of the read voltages VCGR for a page to be read is shown.

In step ST31, the memory controller 200 issues, to the NAND flash memory 100, a read command indicating that a read process using a voltage R0 is to be performed. The NAND flash memory 100 reads data D0 using the voltage R0 and transmits the data D0 to the memory controller 200.

The memory controller 200 temporarily stores the acquired data D0 in the buffer memory 240.

In step ST32, the memory controller 200 issues, to the NAND flash memory 100, a read command indicating that a read process using a voltage R1 is to be performed. The NAND flash memory 100 reads data D1 using the voltage R1 and transmits the data D1 to the memory controller 200. The memory controller 200 temporarily stores the acquired data D1 in the buffer memory 240.

In step ST33, the memory controller 200 calculates the number of interval cells C1 at a representative voltage V1 based on the data D0 and D1. Specifically, the memory controller 200 compares the data D0 and D1, counts the number of bits which are turned off from the on-state, and sets it as the number of interval cells C1. The representative voltage V1 is a freely selected voltage within the range between the voltage R0 and the voltage R1 (hereinafter also referred to as range [R0, R1]), and is expressed, for example, by V1=(R0+R1)/2. Thereby, the number of interval cells C1, which is the number of memory cell transistors MT having a threshold voltage in range [R0,R1], and the representative voltage V1 are stored in the memory 220 in association with each other. Hereinafter, a voltage which is located between two voltages used for the read process in the calculation of the number of interval cells, and which is associated with the number of interval cells will be referred to as a "representative voltage".

In step ST34, the memory controller 200 issues, to the NAND flash memory 100, a read command indicating that a read process using a voltage R2 is to be performed. The NAND flash memory 100 reads data D2 using the voltage R2 and transmits the data D2 to the memory controller 200. The memory controller 200 temporarily stores the acquired data D2 in the buffer memory 240. Although the voltages R0 to R2 is freely set, for the sake of convenience of description, it is assumed in the description below that R0>R1>R2, for example, and R0−R1=R1−R2=ΔT.

In step ST35, the memory controller 200 calculates the number of interval cells C2 at a representative voltage V2 based on the data D1 and D2. The representative voltage V2 is a freely selected voltage within range [R1,R2], and is expressed, for example, by V2=(R1+R2)/2. Thereby, the number of interval cells C2, which is the number of memory cell transistors MT having a threshold voltage in range [R1,R2], and the representative voltage V2 are stored in the memory 220 in association with each other.

In step ST36, the memory controller 200 refers to two points (V1, C1) and (V2, C2) and determines the representative voltage corresponding to the smaller one of the numbers of interval cells C1 and C2 as the read voltage Vest1. That is, if the number of interval cells C1 is smaller than the number of interval cells C2, the memory controller 200 determines the representative voltage V1 corresponding to the number of interval cells C1 as the read voltage Vest1, and if the number of interval cells C2 is smaller than the number of interval cells C1, the memory controller 200 determines the representative voltage V2 corresponding to the number of interval cells C2 as the read voltage Vest1. If the numbers of interval cells C1 and C2 are equal to each other, the memory controller 200 determines that the midpoint value between the representative voltages V1 and V2 is the read voltage Vest1 (Vest1=(V1+V2)/2).

In the above-described manner, the three-point tracking process is finished.

In connection with the example shown in FIG. 8, reference has been made to the case where data D2 is acquired after calculation of the number of interval cells C1 and then the number of interval cells C2 is calculated. However, this case is not restrictive. Specifically, for example, the numbers of interval cells C1 and C2 may be calculated at a time after all data D0 to D2 are acquired. That is, step ST33 shown in FIG. 8 may be performed after step ST34.

In connection with the example shown in FIG. 8, reference has been made to the case where the NAND flash memory 100 transmits data D0 to D2 to the memory controller 200 in steps ST31, ST32 and ST34. However, this case is not restrictive. For example, the NAND flash memory 100 may count the number of on-cells or the number of off-cells based on data D0 to D2 and transmit information indicating the count result to the memory controller 200, in steps ST31, ST32 and ST34. In this case, in step ST33, the memory controller 200 calculates the number of interval cells C1 based on the count result for data D0 and D1, and in step ST35, the memory controller 200 calculates the number of interval cells C2 based on the count results for data D1 and D2.

Figure 9:
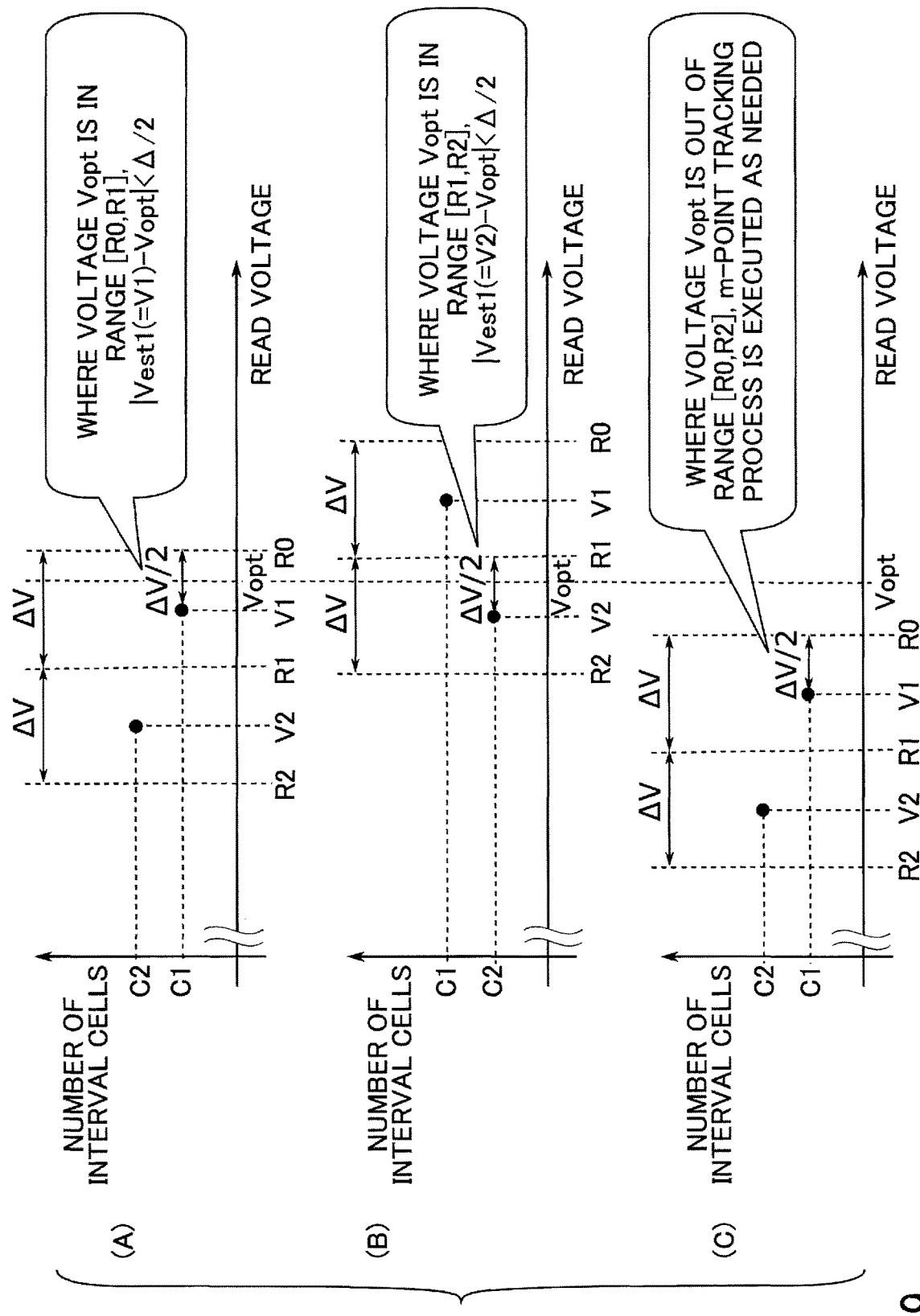
FIG. 9 is a schematic diagram to explain the three-point tracking process performed in the memory system according to the first embodiment.

FIG. 9 is a schematic diagram illustrating three-point tracking process performed in the memory system of the first embodiment. In FIG. 9, a difference of read voltage Vest1 with respect to optimum read voltage Vopt is schematically shown. More specifically, in FIG. 9, influence of a positional relationship between the voltage Vopt and the voltages R0 to R2 on the difference is shown. In the example shown in FIG. 9, an absolute value of the difference between voltages R0 and R1 and an absolute value of the difference between the voltages R1 and R2 are both ΔV(|R0−R1|=|R1−R2|=ΔV). However, the difference between the voltages R0 and R1 and the difference between the voltages R1 and R2 do not have to be the same value, and may be different values.

As shown in FIG. 9A, where the voltage Vopt is in range [R0,R1] and the representative voltage V1 is set at the center of range [R0,R1], the read voltage Vest1 is a voltage that is calculated with respect to the voltage Vopt with a difference of at most (ΔV/2). That is, by setting value ΔV properly, a value close to the voltage Vopt can be calculated as the read voltage Vest1, and thus, the error correction process shown in step ST50 of FIG. 7 can be successfully performed.

Similarly, as shown in FIG. 9B, where the voltage Vopt is in range [R1,R2] and the representative voltage V2 is set at the center of range [R1,R2], the read voltage Vest1 is a voltage that is calculated with respect to the voltage Vopt with a difference of at most (ΔV/2). That is, by setting value ΔV properly, a value close to the voltage Vopt can be calculated as the read voltage Vest1, and thus, the error correction process shown in step ST50 of FIG. 7 can be successfully performed.

In contrast, as shown in FIG. 9C, where the voltage Vopt is out of range [R0,R2], the read voltage Vest1 may be calculated with a difference larger than value (ΔV/2) with respect to the voltage Vopt. Therefore, accuracy of the read voltage Vest1 may deteriorate to such an extent that the error correction process shown in step ST50 of FIG. 7 fails. If the error correction process for the data that is read using the read voltage. Vest1 fails, the m-point tracking process is executed in succession to the three-point tracking process, as shown in step ST60 of FIG. 7. This ensures the accuracy of the tracking process.

1.2.4 m-Point Tracking Processing

Next, the m-point tracking process will be described.

FIG. 10 is a flowchart illustrating the m-point tracking process performed in the memory system of the first embodiment. Steps ST61 to ST66 shown in FIG. 10 correspond to step ST60 in FIG. 7. Like FIG. 8, FIG. 10 shows, for the sake of convenience of description, how process for calculating the read voltage Vest2 corresponding to one of the read voltages VCGR is performed for a cell unit CU to be read.

In step ST61, the memory controller 200 refers again to the memory 220 for the information indicating the two points (V1,C1) and (V2,C2) calculated in step ST30 and referred to in step ST36.

In step ST62, the memory controller 200 determines a read voltage Rk used in the k-th read process (m−1≤k≤3). A method of determining the read voltage Rk will be described later.

In step ST63, the memory controller 200 issues, to the NAND flash memory 100, a read command indicating that the read process using the voltage Rk is to be performed. The NAND flash memory 100 reads data Dk using the voltage Rk and transmits the data Dk to the memory controller 200. The memory controller 200 temporarily stores, for example, the data Dk in the buffer memory 240.

In step ST64, the memory controller 200 uses the data Dk and a voltage adjacent to the voltage Rk (i.e., a voltage corresponding to a voltage (Rk+ΔV) or a voltage (Rk−ΔV)), and calculates the number of interval cells Ck at a representative voltage Vk. The representative voltage Vk can be set at a freely selected voltage within the range between voltage Rk and the voltage adjacent thereto, and is, for example, a midpoint value of the two voltages. Thus, the number of interval cells Ck and the representative voltage Vk are stored in association with each other.

In step ST65, the memory controller 200 examines points (V1,C1) to (Vk,Ck) and determines whether or not there is a point (Vmin, Cmin) at which the number of interval cells becomes a local minimum (local minimum point) other than end points. The "end points" are two points, one of which is a point corresponding to the lowest voltage of the representative voltages V1 to Vk and a point corresponding to the highest voltage thereof. If there is no minimum point (Vmin, Cmin) other than the end points, or if a curve obtained by connecting points (V1,C1) to (Vk,Ck) such that these points are connected in the ascending order with respect to a value of the representative voltage is determined as monotonously decreasing or increasing in the voltage axis direction (step ST65; no), then the process proceeds to step ST66. In step ST66, the memory controller 200 increments k, and then steps ST62 to ST65 are repeatedly executed.

If there is a minimum point (Vmin,Cmin) other than the end points, or if there is a point in the curve, which connects points (V1,C1) to (Vk,Ck) to indicate the value of the representative voltage in the ascending order, in which the number of interval cells changes from decrease to increase in the voltage axis direction (step ST65; yes), then the process proceeds to step ST67. In step ST67, the memory controller 200 determines that the voltage Vmin is the read voltage Vest2. In the description below, reference will be made to the case where the voltage Vmin is determined as the read voltage Vest2. The read voltage Vest2, however, may be derived by a method that ensures higher accuracy, such as internal division calculation.

In the above-described manner, the m-point tracking process is finished.

Figure 11:
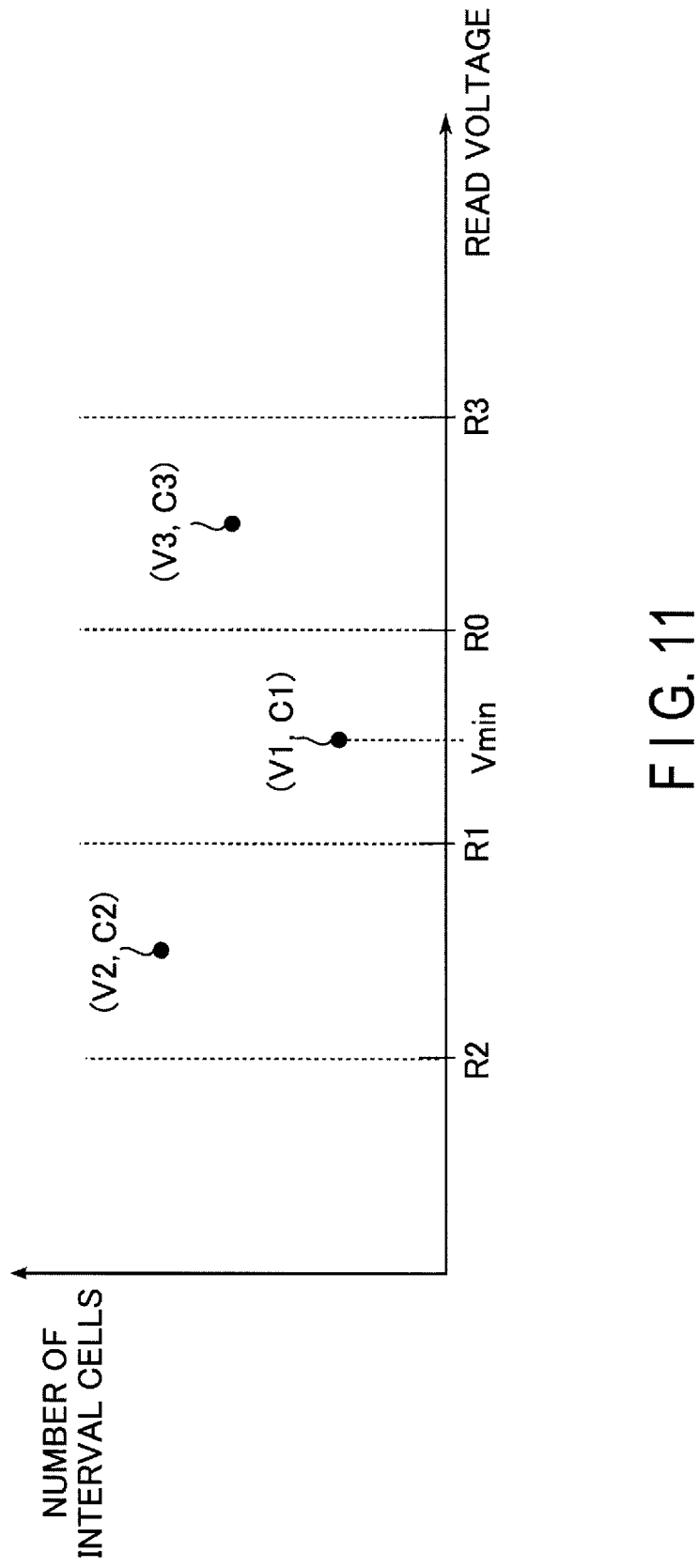
FIG. 11 is a schematic diagram to explain the m-point tracking process performed in the memory system according to the first embodiment.
Figure 12:
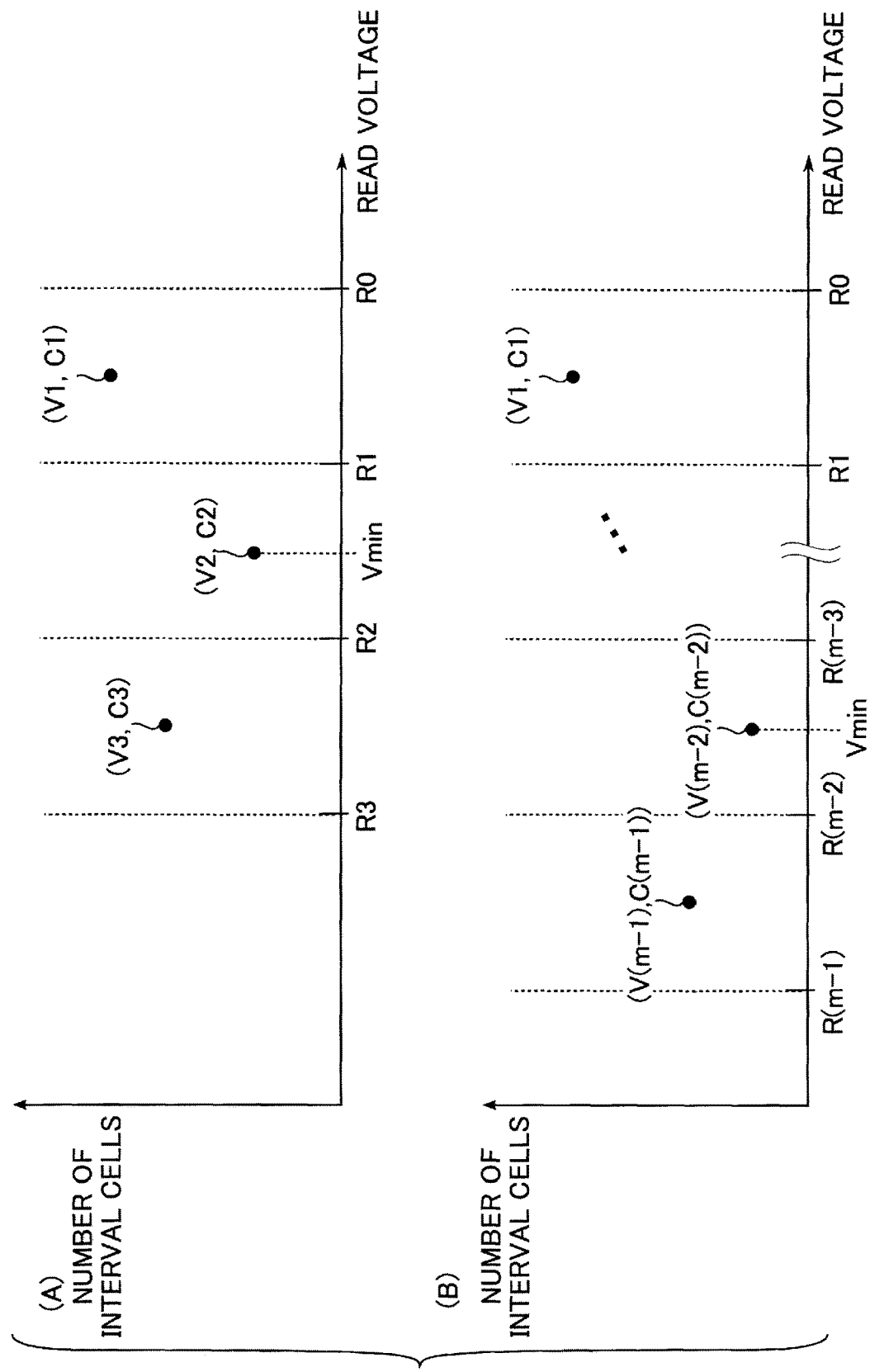
FIG. 12 is a schematic diagram to explain the m-point tracking process performed in the memory system according to the first embodiment.
Figure 13:
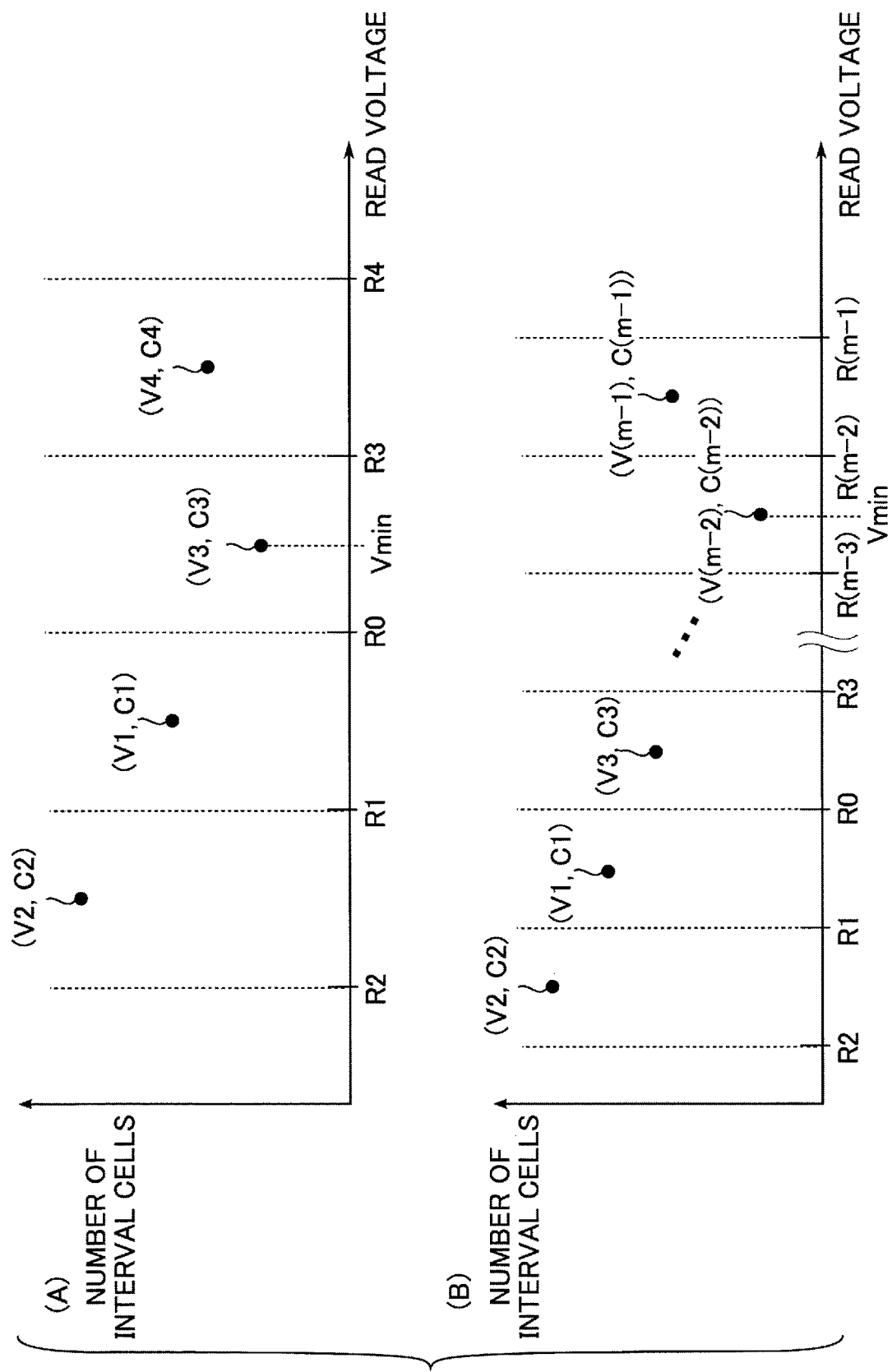
FIG. 13 is a schematic diagram to explain the m-point tracking process performed in the memory system according to the first embodiment.

FIG. 11 to FIG. 13 are schematic diagrams illustrating a read voltage search algorithm of the m-point tracking process performed in the memory system of the first embodiment. In FIG. 11 to FIG. 13, the read voltage search algorithm of the m-point tracking process is classified into three patterns by way of example. That is, FIG. 11 shows a case where the representative voltage V1 is determined to be the representative voltage Vmin. FIG. 12 shows a case where the representative voltage Vmin is determined to be lower than the representative voltage V1, and FIG. 13 shows a case where the representative voltage Vmin is higher than the representative voltage V1. FIG. 12 includes FIG. 12A and FIG. 12B. FIG. 12A shows a case where the representative voltage V2 is determined to be the representative voltage Vmin. FIG. 12B shows a case where the representative voltage V(m−2) is determined to be the representative voltage Vmin (m−2≤3). FIG. 13 includes FIG. 13A and FIG. 13B. FIG. 13A shows a case where the representative voltage V3 is determined to be the representative voltage Vmin. FIG. 13B shows a case where the representative voltage V(m−2) is determined to be the representative voltage Vmin (m−2≥4).

As described above, in the m-point tracking process performed in the memory system of the first embodiment, the numbers of interval cells C1 and C2 calculated in the three-point tracking process are used again. Therefore, the magnitude relationship of the voltages R0 to R2 will be described as R0>R1>R2 similar to the three-point tracking process illustrated in FIG. 9.

As shown in FIG. 11, where the number of interval cells C2 is larger than the number of interval cells C1, it is estimated that the optimum read voltage Vopt is at least higher than the voltage R1. Therefore, in steps ST62 and ST63 of FIG. 10, the memory controller 200 issues, to the NAND flash memory 100, a command indicating that a read process using the voltage R3 higher than the voltage R0 is to be performed, and acquires data D3 from the NAND flash memory 100. Thereby, in step ST64, the memory controller 200 calculates the number of interval cells C3 corresponding to the representative voltage V3 in range [R3,R0], based on the data D0 and D3.

In the case shown in FIG. 11, the number of interval cells C3 is larger than the number of interval cells C1, so that C2>C1 and C1<C3 and the point (V1,C1) is a local minimum point. Therefore, the memory controller 200 can determine the representative voltage V1 as the read voltage Vest2 based on the numbers of interval cells C1 to C3.

As shown in FIG. 12A, where the number of interval cells C2 is smaller than the number of interval cells C1, it is estimated that the optimum read voltage Vopt is at least lower than the voltage R1. Therefore, in steps ST62 and ST63 of FIG. 10, the memory controller 200 issues, to the NAND flash memory 100, a command indicating that a read process using the voltage R3 lower than the voltage R2 is to be performed, and acquires data D3 from the NAND flash memory 100. Thereby, in step ST64, the memory controller 200 calculates the number of interval cells C3 corresponding to the representative voltage V3 in range [R2,R3], based on the data D2 and D3.

In the case shown in FIG. 12A, the number of interval cells C3 is larger than the number of interval cells C2, so that C3>C2 and C2<C1 and point the (V2,C2) is a local minimum point. Therefore, the memory controller 200 can determine the representative voltage V2 as the read voltage Vest2 based on the numbers of interval cells C1 to C3.

As shown in FIG. 12B, where the number of interval cells decreases in the order of C1, C2, . . . , C(m−2), it is estimated that the optimum read voltage Vopt is at least lower than the voltage R2. Therefore, the memory controller 200 repeats the process shown in steps ST62 to ST66 of FIG. 10 until the number of interval cells C(m−1) larger than the number of interval cells C(m−2) is calculated. If the number of interval cells C(m−1) larger than the number of interval cells C(m−2) is calculated, then C(m−1)>C(m−2) and C(m−2)<

C(m−3)< . . . <C2<C1 and the point (V(m−2), C(m−2)) is a local minimum point. Therefore, the memory controller 200 can determine the representative voltage V(m−2) as the read voltage Vest2 based on the numbers of interval cells C1 to C(m−1).

As shown in FIG. 13A, where the number of interval cells C2 is larger than the number of interval cells C1 and the number of interval cells C3 is smaller than the number of interval cells C1, it is estimated that the optimum read voltage Vopt is at least higher than the voltage R0. Therefore, in steps ST62 and ST63 of FIG. 10, the memory controller 200 issues, to the NAND flash memory 100, a command indicating that a read process using the voltage R4 higher than the voltage R3 is to be performed, and acquires data D4 from the NAND flash memory 100. Thereby, in step ST64, the memory controller 200 calculates the number of interval cells C4 corresponding to the representative voltage V4 in range [R4,R3], based on the data D3 and D4.

In the case shown in FIG. 13A, the number of interval cells C4 is larger than the number of interval cells C3, so that C4>C3 and C3<C1 and the point (V3,C3) is a local minimum point. Therefore, the memory controller 200 can determine the representative voltage V3 as the read voltage Vest2 based on the numbers of interval cells C1 to C4.

As shown in FIG. 13B, where the number of interval cells decreases in the order of C2, C1, C3, . . . , C(m−2), it is estimated that the optimum read voltage Vopt is at least higher than the voltage R0. Therefore, the memory controller 200 repeats the process shown in steps ST62 to ST66 of FIG. 10 until the number of interval cells C(m−1) larger than the number of interval cells C(m−2) is calculated. If the number of interval cells C(m−1) larger than the number of interval cells C(m−2) is calculated, then C2>C1>C3> . . . >C(m−3)>C(m−2) and C(m−2)<C(m−1) and point (V(m−2),C(m−2)) is a local minimum point. Therefore, the memory controller 200 can determine the representative voltage V(m−2) as the read voltage Vest2 based on the numbers of interval cells C1 to C(m−1).

By the operation described above, the memory controller 200 calculates the read voltage Vest2 by calculating the numbers of interval cells at three points or more obtained by performing at least four read processes in the m-point tracking process.

1.3 Effects of Present Embodiment

According to the first embodiment, the memory controller 200 performs read process three times, using voltages R0 to R2, and acquires data D0 to D2 from the NAND flash memory 100. The memory controller 200 calculates the numbers of interval cells C1 and C2 at two points based on the data D0 to D2, and determines read voltage Vest1 based on the numbers of interval cells at the two points. As a result, the read process required for searching for the read voltage Vest1 is performed only three times, and the time for the tracking process can be shortened as compared with the m-point tracking process requiring read process four or more times.

To supplement the description, the tracking process can generally calculate a read voltage with a smaller difference with respect to the optimum read voltage Vopt in accordance with an increase in the number of pieces of data to be read out (that is, in accordance with an increase in the number of times the read process is performed). At the same time, however, the time required for the tracking process becomes longer in accordance with an increase in the number of times the read process is performed, and the read process response time of the memory controller 200 to the host device 300 may deteriorate. Therefore, there is a need for tracking process that can be performed at higher speed while maintaining the accuracy that ensures successful error correction process. In particular, in a situation where the memory system 1 is powered on at all times, it is considered that the change in threshold voltage distribution is smaller than that of the situation in which the memory system 1 is turned off. For this reason, where the memory system 1 is powered on at all times, it is considered that a read voltage can be calculated with sufficiently high accuracy even in the tracking process in which the number of times the read process is performed is small. Therefore, tracking process that can be performed at high speed is useful.

According to the first embodiment, the memory controller 200 calculates the numbers of interval cells at two points by performing read process three times, and determines the representative voltage corresponding to the smaller one as read voltage Vest1. Thereby, if optimum read voltage Vopt exists in range [R0,R2], read voltage Vest1 can be calculated with respect to voltage Vopt, with an accuracy of less than or equal to ΔV/2 (ΔV is an interval between voltages R0 and R1 used for the read process and is also an interval between voltages R1 and R2). Therefore, by setting value ΔV to a proper value, read voltage Vest1 ensuring high speed operation and desired accuracy can be calculated.

If voltage Vopt is out of range [R0,R2], the desired accuracy may not be ensured, but in this case, m-point tracking process is executed in succession to the three-point tracking process. In the m-point tracking process, information indicating points (V1,C1) and (V2,C2) used in the three-point tracking process is used. Therefore, even when the m-point tracking process is performed in succession to the three-point tracking process, read voltage Vest2 can be calculated substantially in the same time as the case where the m-point tracking process is performed once. Therefore, even if the correction process fails at read voltage Vest1 in the three-point tracking process, read voltage Vest2 can be calculated in the m-point tracking process without increasing the time of the entire tracking process more than the time of the m-point tracking process performed once.

2. Second Embodiment

Next, a memory system according to a second embodiment will be described. According to the first embodiment, in the three-point tracking process, the representative voltage corresponding to the smaller one of the numbers of interval cells C1 and C2 is determined as the read voltage Vest1. The second embodiment differs from the first embodiment in that in the three-point tracking process, a voltage corresponding to a point at which range [V1, V2] is internally divided by the ratio between the numbers of interval cells C1 and C2 is determined as the read voltage Vest1. In the description below, the configurations and operations similar to those of the first embodiment will be omitted, and mainly the configurations and operations different from those of the first embodiment will be described.

2.1.3 Three-Point Tracking Process

FIG. 14 is a flowchart illustrating the three-point tracking process performed in a memory system of the second embodiment. FIG. 14 corresponds to FIG. 8 referred to in connection with the first embodiment, and step ST37 is executed instead of step ST36 shown in FIG. 8.

Since the processes in steps ST31 to ST35 shown in FIG. 14 are similar to the processes in steps ST31 to ST35 shown in FIG. 8, a description thereof will be omitted. According to these processes in steps ST31 to ST35, three read processes using different voltages R0 to R2 are performed on one of a read voltages VCGR, and data D0 to D2 are read. Based on data D0 to D2, the number of interval cells C1 associated with a representative voltage V1 and the number of interval cells C2 associated with a representative voltage V2 are calculated.

In step ST37, the memory controller 200 calculates an internal-dividing point of the representative voltages V1 and V2, based on the numbers of interval cells C1 and C2, and determines the internal-dividing point as a read voltage Vest1. Specifically, the memory controller 200 calculates the read voltage Vest1 from the following formula:

$$Vest1 = V1 - (V1 - V2) \times C1/(C1+C2)$$

In the above-described manner, the three-point tracking process is finished.

Figure 15:
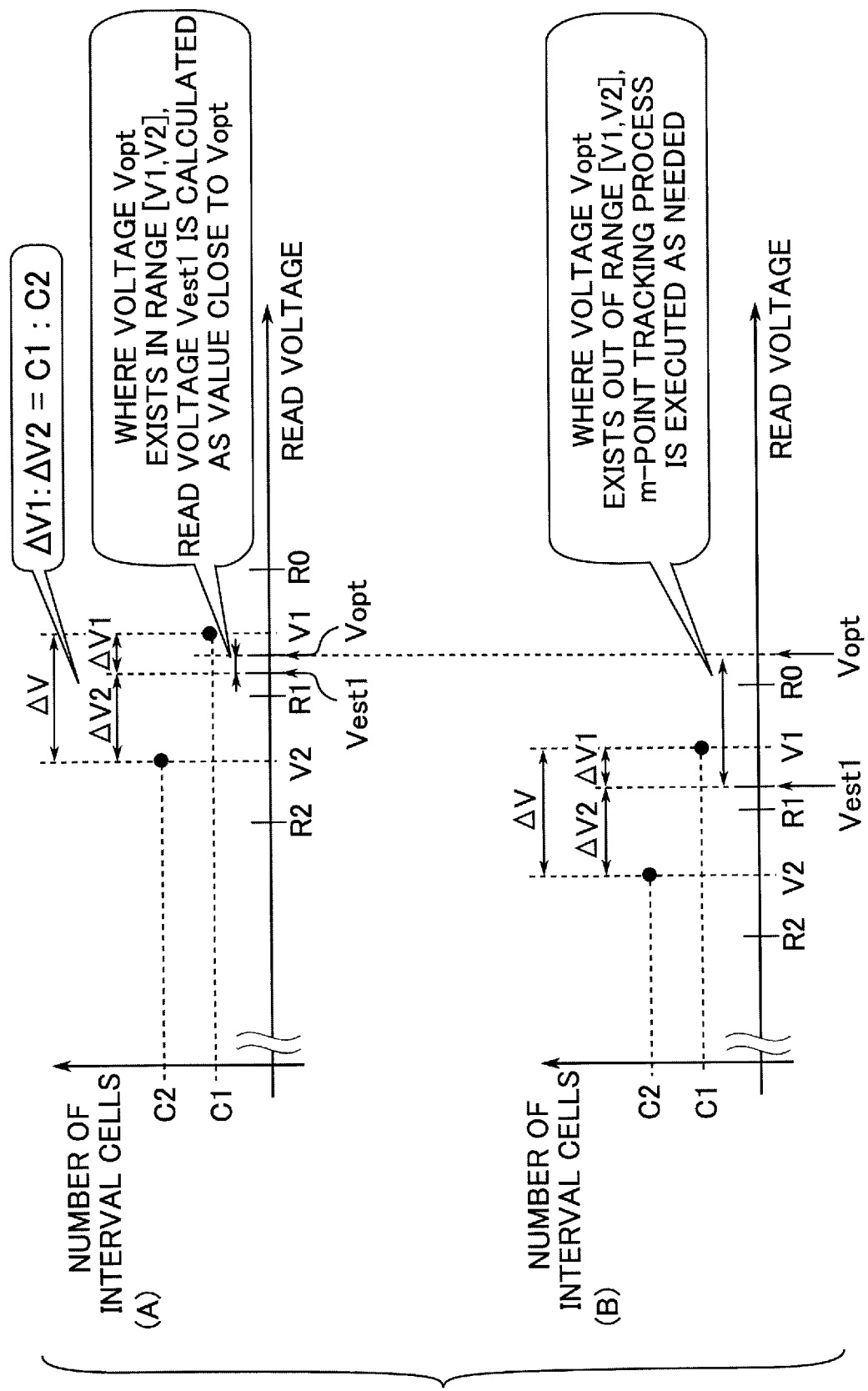
FIG. 15 is a schematic diagram to explain the three-point tracking process performed in the memory system according to the second embodiment.

FIG. 15 is a schematic diagram illustrating the three-point tracking process performed in the memory system of the second embodiment. FIG. 15 schematically shows an influence of the positional relationship between an unknown optimum read voltage Vopt and the representative voltages V1 and V2 on a difference of the read voltage *Vest*1 with respect to the voltage Vopt. In the example shown in FIG. 15, the absolute value of the difference between the representative voltages V1 and V2 is assumed to be value $\Delta V$ ($|V1-V2|=\Delta V$).

Since, as described above, the read voltage Vest1 is calculated as a point that internally divides range [V1, V2], the read voltage Vest1 always exists between the representative voltage V1 and the representative voltage V2. As shown in FIG. 15A, therefore, where the voltage Vopt exists in range [V1,V2], the read voltage Vest1 is calculated with a difference of at most value $\Delta V/2$ with respect to the voltage Vopt. In addition, the internal division ratio for calculating the read voltage Vest1 is adaptively changed in accordance with the values of the numbers of interval cells C1 and C2. For this reason, the fluctuation of the amount of the difference depending on the position of the voltage Vopt in range [V1,V2] is suppressed, and an increase of the average value of the difference is suppressed.

Assuming that the absolute value |V1−Vest1| that is the difference between the representative voltage V1 and the read voltage Vest1 is a value $\Delta V1$, and the absolute value |V2−Vest1| that is the difference between the representative voltage V2 and the read voltage Vest1 is a value $\Delta V2$, the relationship between the numbers of interval cells C1 and C2 and the values $\Delta V1$ and $\Delta V2$ is as following:

$$\Delta V1 : \Delta V2 = C1 : C2$$

That is, the read voltage Vest1 is calculated as a value close to the representative voltage V1 when the number of interval cells C1 is smaller than the number of interval cells C2, and is calculated as a value close to the representative voltage V2 when the number of interval cells C1 is larger than the number of interval cells C2. In other words, the read voltage Vest1 is close to the representative voltage corresponding to the smaller one of the numbers of interval cells C1 and C2 in accordance with an increase of the difference between the numbers of interval cells C1 and C2.

The number of interval cells C takes a smaller value as it is closer to the voltage Vopt. For this reason, it is expected that the voltage Vopt is a value close to the representative voltage corresponding to the smaller one of the numbers of interval cells C1 and C2.

Thus, the read voltage Vest1 is calculated as a value that is located on the side where the voltage Vopt is expected to exist. Therefore, the difference of the read voltage Vest1 with respect to the voltage Vopt can be made further smaller.

In contrast, as shown in FIG. 15B, where the voltage Vopt exists out of range [V1,V2], the read voltage Vest1 may be calculated with a difference larger than value $\Delta V/2$ with respect to the voltage Vopt. For this reason, the accuracy of the read voltage Vest1 may deteriorate to such an extent that error correction process for data which is read using the read voltage Vest1 fails. As mentioned in connection with step ST50 shown in FIG. 7, if the error correction process for the data which is read using the read voltage Vest1 fails, the m-point tracking process is executed subsequently to the three-point tracking process, as shown in step ST60 of FIG. 7. Thus, the read voltage Vest2 can be calculated, and the accuracy of the entire tracking process can be ensured.

2.2 Effects of Present Embodiment

According to the second embodiment, the memory controller 200 determines that a voltage corresponding to the point at which range [V1,V2] is internally divided is the read voltage Vest1, based on the ratio between the numbers of interval cells C1 and C2. Thereby, if the voltage Vopt exists in range [V1,V2], the read voltage Vest1 with a small difference with respect to the voltage Vopt can be calculated by the three-point tracking process. Therefore, as compared with the conventional m-point tracking process, the time required for the tracking process can be shortened.

If the voltage Vopt is out of range [V1,V2] and the difference of the read voltage Vest1 becomes large, the memory controller 200 executes the m-point tracking process subsequently to the three-point tracking process. Thus, the read voltage Vest2 and Vest1 can be calculated within a time of one m-point tracking process, and the increase of the time required for the tracking process can be suppressed.

3. Third Embodiment

Next, a memory system according to a third embodiment will be described. According to the third embodiment, the relationship between the number of interval cells and a representative voltage is approximated by a quadratic function. The third embodiment differs from the first and second embodiments in that in the three-point tracking process, a quadratic function passing through two points (V1,C1) and (V2,C2) is specified and a voltage corresponding to a minimum point of the quadratic function is determined as the read voltage Vest1. In the description below, the configurations and operations similar to those of the first embodiment will be omitted, and mainly the configurations and operations different from those of the first embodiment will be described.

3.1 Three-Point Tracking Process

Figure 16:
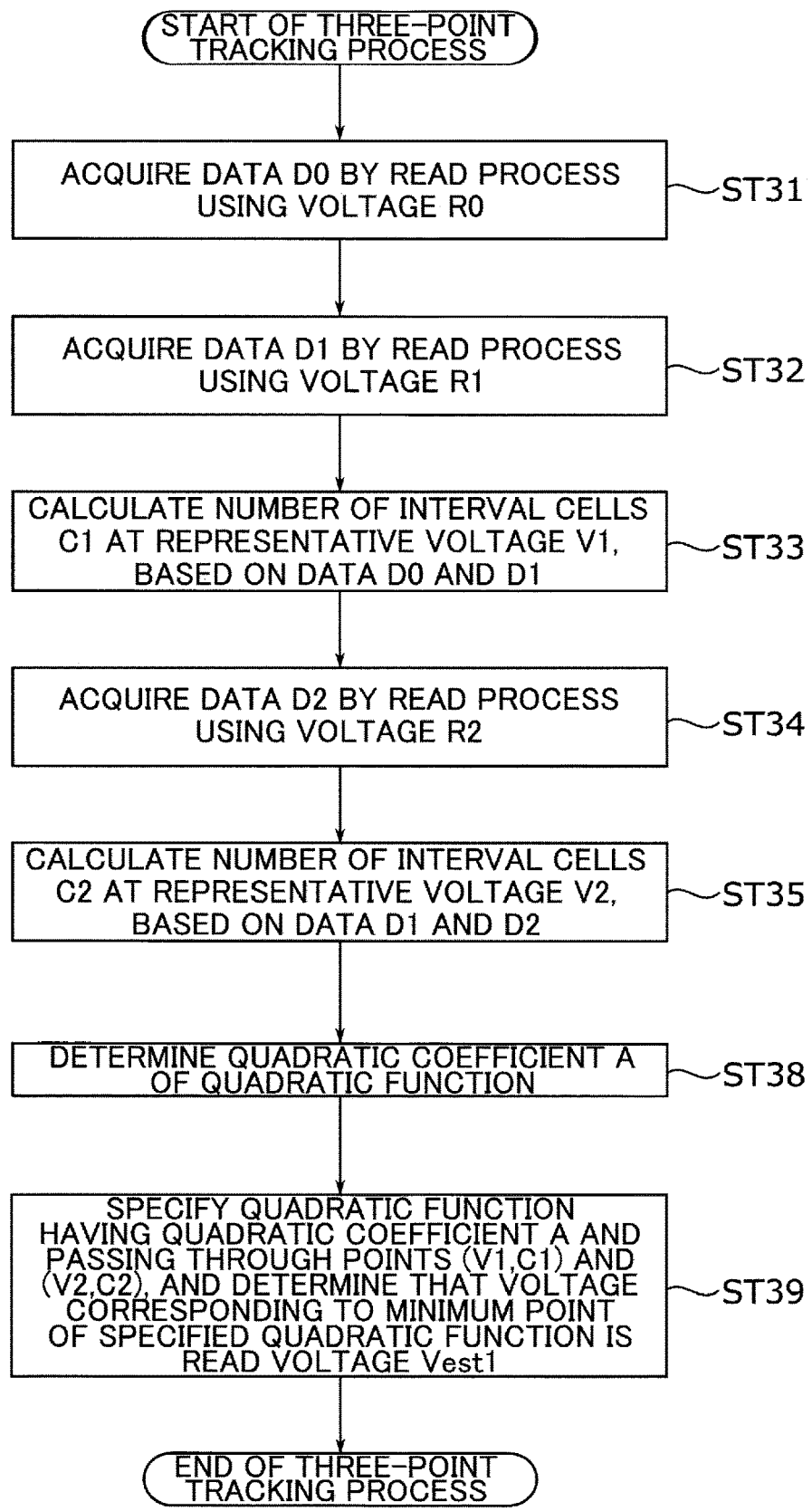
FIG. 16 is a flowchart to explain a three-point tracking process performed in a memory system according to a third embodiment.

FIG. 16 is a flowchart illustrating a three-point tracking process performed in a memory system of the third embodiment. FIG. 16 corresponds to FIG. 8 referred to in connection with the first embodiment, and steps ST38 and ST39 are executed instead of step ST36 shown in FIG. 8.

Since the processes in steps ST31 to ST35 shown in FIG. 16 are similar to the processes in steps ST31 to ST35 shown in FIG. 8, a description thereof will be omitted. According to these processes in steps ST31 to ST35, three read processes using different voltages R0 to R2 are performed on one of a read voltages VCGR, and data D0 to D2 are read. Based on the data D0 to D2, the number of interval cells C1 associated with a representative voltage V1 and the number of interval cells C2 associated with a representative voltage V2 are calculated.

In step ST38, the memory controller 200 determines a quadratic coefficient A of a quadratic function to be specified, in order to identify the quadratic function from among quadratic functions that can pass through two points (V1, C1) and (V2,C2). The quadratic function represents the relationship between the number of interval cells C and the representative voltage V, and is a function that outputs the number of interval cells C1 when the representative voltage V1 is input thereto and that outputs the number of interval cells C2 when the representative voltage V2 is input thereto. The quadratic function necessarily has a downward convex shape in order to approximate the shape of an overlap (valley position) between adjacent threshold voltage distributions. Therefore, the quadratic coefficient A determined in step ST38 has a positive value (A>0). That is, the above-mentioned quadratic function satisfies the relationships shown below:

$$C1=A(V1-Vest1)^2+Cest1;$$

and $$C2=A(V2-Vest1)^2+Cest1.$$

Cest1 is the number of interval cells corresponding to the minimum point of the quadratic function (that is, the coordinate values of the minimum point are (Vest1,Cest1)).

The memory controller 200 may store the quadratic coefficient A, for example, as a predetermined fixed value in the memory 220 or the like, but this is not restrictive. The memory 220 or the like may store a table in which some values of the quadratic coefficient A can be selected in accordance with parameters.

As described above, the threshold voltage distribution is under the influence of a data retention error or the like, and may change in accordance with an elapsed time after write process (hereinafter, referred to simply as "elapsed time"). In addition, since the characteristics of the memory cell array 110 inevitably change after a repetition of write process and erase process, the threshold voltage distribution may change in accordance with the number of times the write process and erase process are performed (hereinafter also referred to as "W/E cycles"). In addition, a fluctuation characteristics of the threshold voltage distribution may change depending on a difference in stacking positions of cell units CU, a difference in layers of coupled word lines WL, or a difference in manufacturing processes of the memory cell array 110. In the description below, a word line coupled to a group of memory cell transistors MT may be simply referred to as a "word line".

Therefore, when the quadratic coefficient A associated with parameters is stored as a table, the parameters include an elapsed time, W/E cycles, a coupled word line WL, a manufacturing process of the memory cell array 110, etc.

In step ST39, the memory controller 200 specifies a quadratic function having the quadratic coefficient A determined in step ST38 and passing through the two points (V1,C1) and (V2,C2). Then, the memory controller 200 determines that the voltage corresponding to the minimum point of the specified quadratic function is the read voltage Vest1.

To be more specific, the memory controller 200 calculates the read voltage Vest1 according to the following formula $$Vest1=(V1+V2)/2-(C1-C2)/2A(V1-V2).$$

In the above-described manner, the three-point tracking process is finished.

Figure 17:
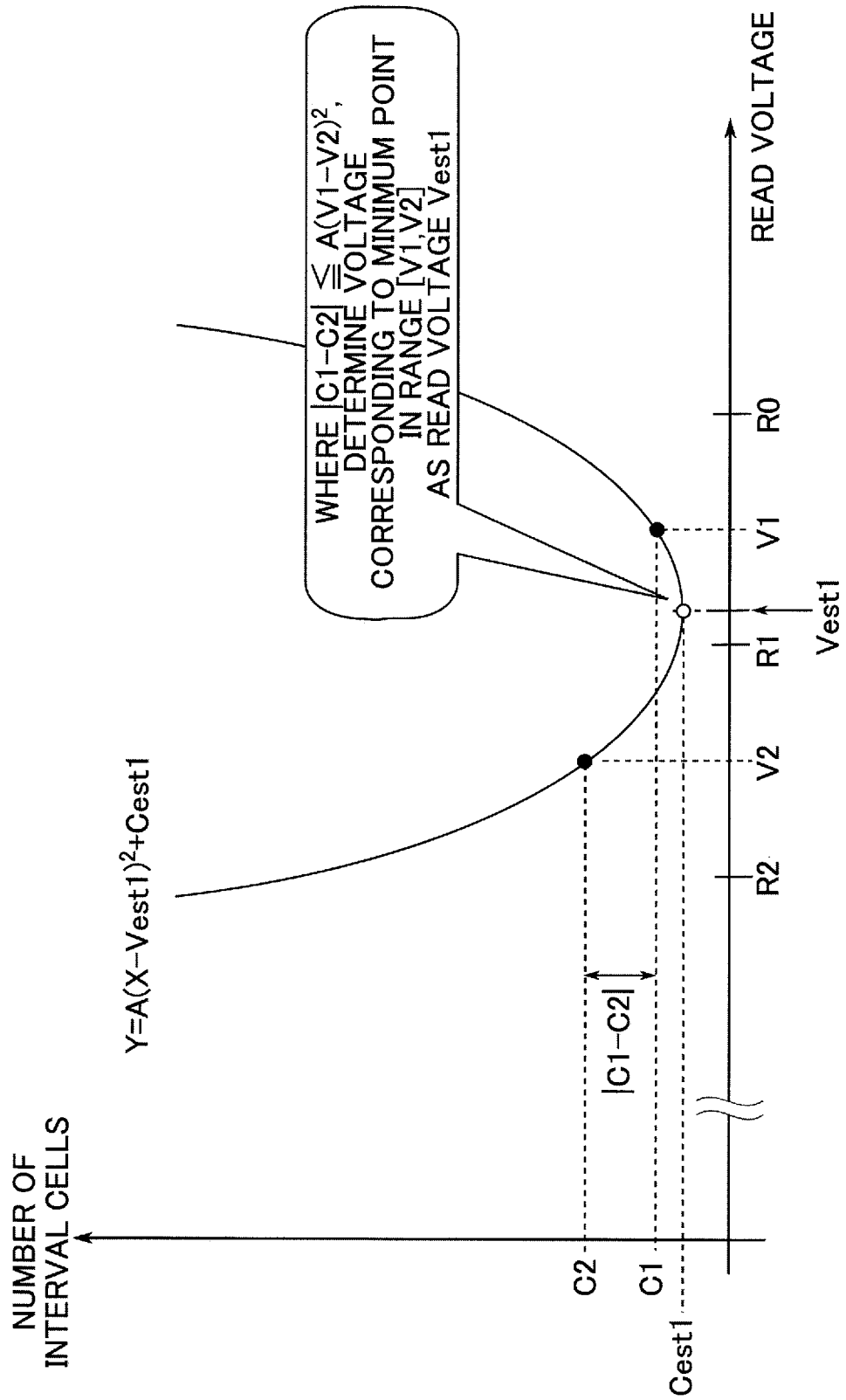
FIG. 17 is a schematic diagram to explain the three-point tracking process performed in the memory system according to the third embodiment.

FIG. 17 and FIG. 18 are schematic diagrams illustrating the three-point tracking process performed in the memory system of the third embodiment. In both FIG. 17 and FIG. 18, it is assumed that the numbers of interval cells C1 and C2 are obtained from the voltages R0 to R2. FIG. 17 schematically shows a case where the minimum point of the quadratic function exists in range [V1,V2]. FIG. 18 schematically shows a case where the minimum point of the quadratic function exists out of range [V1,V2]. FIG. 17 and FIG. 18 correspond to step ST39 shown in FIG. 16.

First, the case where the minimum point is located between two points (V1,C1) and (V2,C2) will be described with reference to FIG. 17.

As shown in FIG. 17, the memory controller 200 uses determined coefficient A and calculates a minimum point (Vest1,Cest1) of a quadratic function $Y=A(X-Vest1)^2+Cest1$, which passes through two points (V1,C1) and (V2,C2). When the absolute value |C1−C2| of the difference between two numbers of interval cells is sufficiently small (specifically, where $|C1-C2| \leq A(V1-V2)^2$), the read voltage Vest1 is calculated as a value within range [V1,V2].

In contrast, when the absolute value |C1−C2| is sufficiently large (specifically, where $|C1-C2|>A(V1-V2)^2$), as shown in FIG. 18, the read voltage Vest1 is calculated as a value outside range [V1,V2].

In either case, according to the third embodiment, the memory controller 200 can calculate, as the read voltage Vest1, a voltage that minimizes the number of interval cells regardless of whether the optimum read voltage Vopt is in range [V1,V2].

3.2 Effects of Present Embodiment

According to the third embodiment, in the three-point tracking process, the memory controller 200 predetermines a quadratic coefficient A of a quadratic function representing the relationship between a representative voltage and the number of interval cells. The memory controller 200 specifies the quadratic function having the quadratic coefficient A and passing through two points (V1,C1) and (V2,C2), and determines a voltage at the minimum point of the quadratic function as a read voltage Vest1. Regardless of whether a voltage Vopt exists in range [V1,V2], a voltage value which is along the shape of the quadratic function specified by the quadratic coefficient A and which permits the number of interval cells to be a minimum value can be calculated as the voltage Vest1. Therefore, as long as the shape of the quadratic function specified by the quadratic coefficient A conforms to the actual situation, a value close to the optimum read voltage Vopt can be calculated as the read voltage Vest1, using the numbers of interval cells only at two points.

The quadratic coefficient A is determined in advance before the tracking process. The quadratic coefficient A may be a fixed value or may be parametrically changeable according to a predetermined table. The parameters include an elapsed time, W/E cycles, a difference in stacking positions of cell units CU, a difference in layers of coupled word lines WL, and the manufacturing process of the memory cell array 110. Thereby, the quadratic function can be changed to have a proper shape in accordance with factors that may change the threshold voltage distributions.

Therefore, the read voltage Vest1 can be accurately calculated according to the usage condition of the NAND flash memory 100.

3.3 Modification

In connection with the third embodiment, reference has been made to a case where the quadratic coefficient A is a predetermined fixed value or is determined based on a table. However, this is not restrictive. For example, the quadratic coefficient A may be adaptively updated in accordance with the result of last-performed tracking process each time the tracking process is performed. In the description below, the configurations and operations similar to those of the third embodiment will be omitted, and mainly the configurations and operations different from those of the third embodiment will be described.

Figure 19:
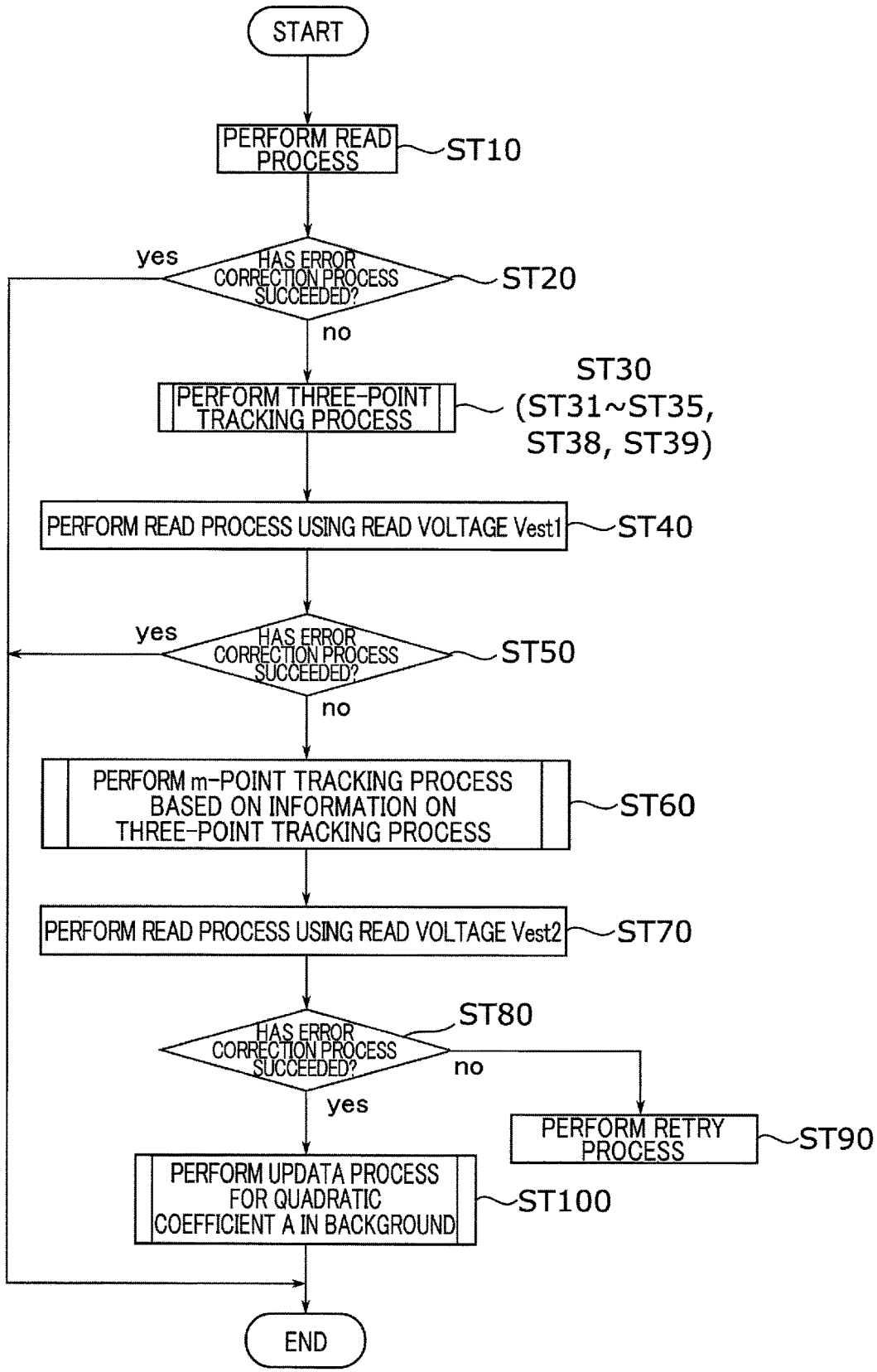
FIG. 19 is a flowchart to explain a process performed in a case where an update process on a quadratic coefficient of a quadratic function is performed in a background after a tracking process is executed in a memory system according to a modification of the third embodiment.

3.3.1 Case Where Update Process is Performed in the Background After Tracking Process An example of process that a memory system according to a modification of the third embodiment performs in a case where update process is executed in the background after tracking process will be described using a flowchart shown in FIG. 19. FIG. 19 shows an example of a flow in which the update process of updating the quadratic coefficient A is performed in the background after the end of the read process that includes various kinds of tracking process.

Since the processes in steps ST10 to ST90 shown in FIG. 19 are similar to the processes in steps ST10 to ST90 shown in FIG. 7, a detailed description thereof will be omitted. In step ST30, steps ST31 to ST35, step ST38 and step ST39 of FIG. 16 referred to in connection with the third embodiment are executed. That is, in step ST30, the memory controller 200 determines, as a read voltage Vest1, a voltage corresponding to the minimum point of the quadratic function that is specified based on the numbers of interval cells at two points and a quadratic coefficient A. As the quadratic coefficient A used for calculation of the read voltage Vest1, for example, a value stored in the memory 220 is referred to.

If, in the error correction process of step ST80, read data does not contain an error or the error can be corrected by the ECC circuit 260 (that is, the error correction process using the read voltage Vest1 fails and the error correction process using the read voltage Vest2 succeeds) (Step ST80; yes), then the data read process ends and the process proceeds to step ST100.

In step ST100, the memory controller 200 executes the update process of the quadratic coefficient A in the background. Note that "a process executed in the background" in the present modification includes, for example, a process that is executed as follows: (A) executing a process after the end of tracking process and in a period in which response performance to a request of another process requested from the host device 300 is not affected (for example, a period after read data is transmitted in response to an initial read request received from the host device 300); and (B) executing a process beforehand (for example, as soon as possible) after the end of the tracking process such that the process is finished before a next read process for the same physical address is requested from the host device 300.

Details of the update process will be described later.

In the manner described above, a series of processes performed while the update process is executed in the background after the tracking process is finished.

Figure 20:
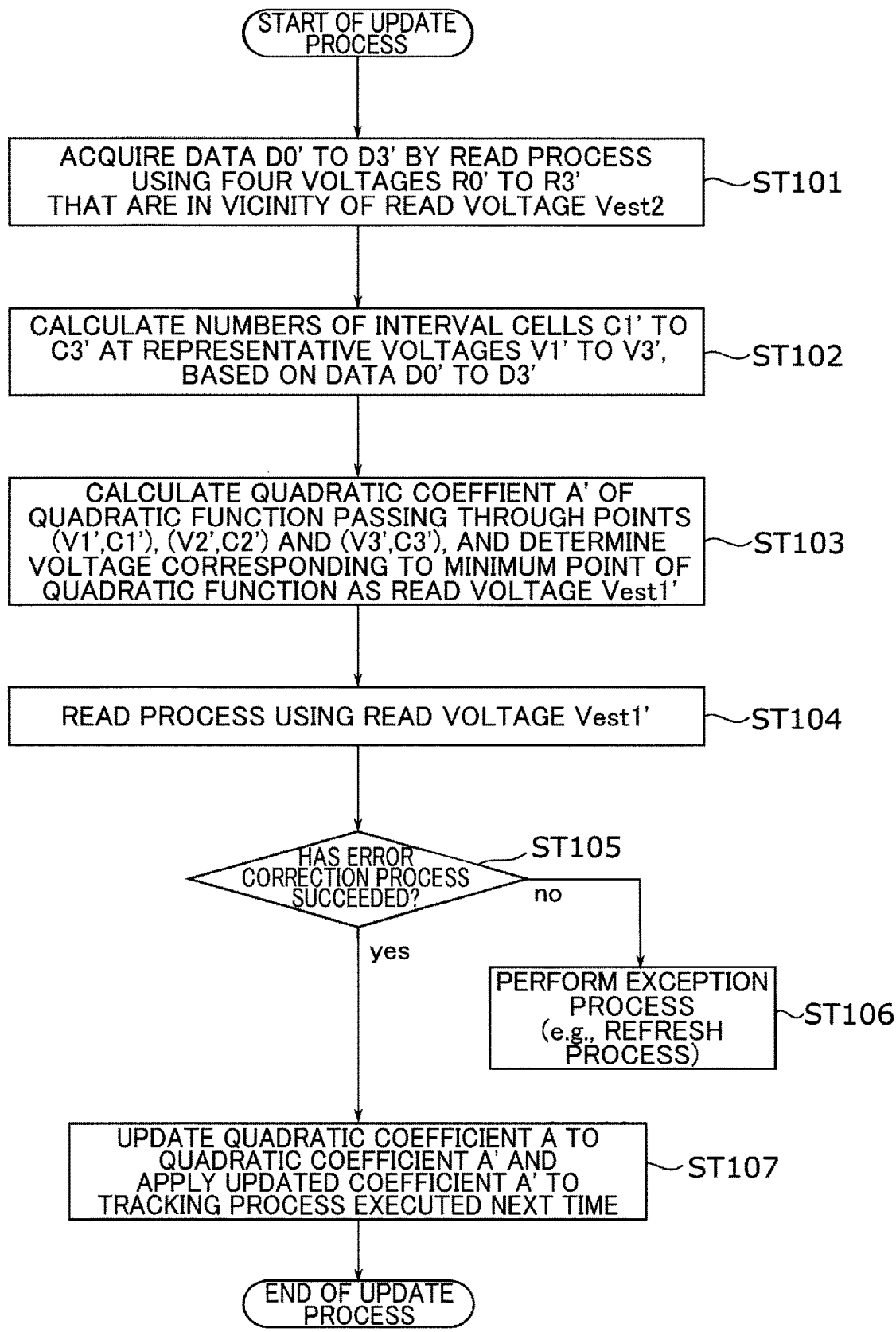
FIG. 20 is a flowchart to explain the update process on the quadratic coefficient of the quadratic function performed in the background in the memory system according to the modification of the third embodiment.

FIG. 20 is a flowchart illustrating the update process of a quadratic coefficient A performed in the background in the memory system of the modification of the third embodiment.

As shown in FIG. 20, in step ST101, the memory controller 200 acquires data D0' to D3' by performing read process four times using four voltages R0' to R3' that are in the vicinity of the read voltage Vest2. The voltages R0' to R3' are set at equal intervals of, for example, value ΔV. The "four voltages R0' to R3' that are in the vicinity of the read voltage Vest2" is intended to include, for example, a case where the read voltage Vest2 is located between the maximum and minimum values of the four voltages R0' to R3'. This, however, is not restrictive, and any of voltages R0' to R3' may be set higher or lower than the read voltage Vest2.

In step ST102, the memory controller 200 calculates the number of interval cells C1' associated with a representative voltage V1', the number of interval cells C2' associated with a representative voltage V2', and the number of interval cells C3' associated with a representative voltage V3', based on the data D0' to D3'.

In step ST103, the memory controller 200 specifies a quadratic function that passes through three points (V1',C1'), (V2',C2') and (V3',C3') from among the quadratic functions representing relationships between the representative voltages and the numbers of interval cells, and calculates a quadratic coefficient A' of the specified quadratic function. Then, the memory controller 200 determines that a voltage corresponding to the minimum point of the specified quadratic function is a read voltage Vest1'.

In step ST104, the memory controller 200 issues, to the NAND flash memory 100, a read command indicating that a read process is to be performed using the read voltage Vest1' calculated in step ST103. The NAND flash memory 100 reads data from a read target page, using the read voltage Vest1'. The NAND flash memory 100 transmits the read data to the memory controller 200.

In step ST105, the memory controller 200 causes the ECC circuit 260 to execute an error correction process in response to the reception of the read data. If the error correction is not succeeded by the ECC circuit 260 (step ST105; no), the process proceeds to step ST106. In step ST106, the memory controller 200 executes an exception process such as a refresh process. The refresh process includes, for example, a process of relocating written data to another block BLK or writing once again to the target block BLK after erasing data such that the changed threshold voltage distribution can be returned to an ideal state that is immediately after the write process. Further, the refresh process may include execution of a method of reprogramming the same data to the target block BLK to reduce adverse effects of the data retention error.

In contrast, if the read data does not contain an error, or if the error can be corrected by the ECC circuit 260 (step ST105 of FIG. 20; yes), the process proceeds to step ST107. In step ST107, the memory controller 200 updates the value of quadratic coefficient A stored in the memory 220 to quadratic coefficient A' calculated in step ST103. Thereby, quadratic coefficient A' is applied to the tracking process executed next time or later.

In the manner described above, the update process for the quadratic coefficient A' is finished. In connection with the example shown in FIG. 20, reference has been made to the case where the processes (steps ST104 to ST106) for confirming whether data can be correctly read using the read voltage Vest1' are performed. This, however, is not restrictive. Specifically, for example, steps ST104 to ST106 may be omitted, and the process may proceed to step ST107 after step ST103.

3.3.2 Effects of Present Modification

According to the modification of the third embodiment, the memory controller 200 executes the update process of the quadratic coefficient A after the end of the tracking process. In the update process, a quadratic function representing the relationship between representative voltages and the numbers of interval cells is specified, based on at least three points of the numbers of interval cells and representative voltages corresponding to the numbers of interval cells. As a result, a quadratic function can be specified using only actually measured numbers of interval cells and representative voltages, without reference to quadratic coefficient A determined in advance, and quadratic coefficient A' that accords with the current threshold voltage distributions can be calculated. Thus, deterioration in the accuracy of read voltage Vest1 can be suppressed by applying quadratic coefficient A' to the next host read process performed for the same physical address.

In addition, the update process is executed during a period in which response performance to a process request from the host device 300 is not affected or before execution of next host read process for the same physical address. Thus, the quadratic coefficient can be updated from A to A' without degrading the response performance of the memory controller 200 to the host device 300. The memory controller 200 caches read voltage Vest1' calculated based on quadratic coefficient A'. Thus, read voltage Vest1' can be used in the next host read process performed for the same physical address. Therefore, the read voltage can be kept as close as possible to the optimum value.

In connection with the example shown in FIG. 19, reference has been made to a case where the update process is executed when the error correction process (step ST20) of the host read process in step ST10 and the error correction process (step ST50) of the read process using the result of the three-point tracking process end in failure. However, this is not restrictive. For example, the update process may be performed in advance in preparation for the host read process to be executed next for a physical address without reference to the failure or success of the host read process for that physical address. Also, the update process may be executed in the memory system 1 in preparation for host read process newly executed for a physical address, without using the host read process for that physical address as a trigger. That is, executing the update process in the background includes performing process in advance while response performance to a process request from the host device 300 is not affected and in preparation for a new read process request from the host device 300.

4. Others

Although several embodiments have been described, the first, second, and third embodiments described above are not restrictive, and various modifications are applicable.

According to the modification of the third embodiment, in step ST101 shown in FIG. 20, four read processes are newly executed to acquire data D0' to D3', and subsequently, in step ST102, the numbers of interval cells C1' to C3' are calculated based on the data D0' to D3'. However, this is not restrictive. For example, instead of executing steps ST101 and ST102, three numbers of interval cells at three points calculated in the m-point tracking process shown in step ST60 of FIG. 19 may be used. In this case, the load on the memory system 1 can be reduced further because the update process for quadratic coefficient A' performed in the background does not necessitate execution of new read process.

The numbers of interval cells used in the update process for updating quadratic coefficient A' is not limited to those at three points, and may be those at four or more points. That is, when the numbers of interval cells calculated by the m-point tracking process are used, the numbers of interval cells at four or more points calculated by the m-point tracking process may be used. In the case of the modification of the third embodiment, the numbers of interval cells at four or more points may be calculated, instead of performing steps ST101 and ST102 shown in FIG. 20. In this case, the memory controller 200 may calculate quadratic coefficient A', for example, by specifying a quadratic function that minimizes a difference from the calculated numbers of interval cells at four or more points.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system comprising:
a semiconductor memory including a plurality of memory cells; and
a memory controller configured to perform a first tracking process on the plurality of memory cells to determine a first voltage, and to read data from the plurality of memory cells using the first voltage in a read process after the first tracking process,
wherein, in the first tracking process, the memory controller is configured to:
read only first data, second data and third data from the plurality of memory cells, the first data being read using a second voltage, the second data being read using a third voltage, the third data being read using a fourth voltage;
determine a number of first memory cells included among the plurality of memory cells, the first memory cells each having a threshold voltage in a first voltage range, the first voltage range being between the second voltage and the third voltage, based on the first data and the second data;
determine a number of second memory cells included among the plurality of memory cells, the second memory cells each having a threshold voltage in a second voltage range, the second voltage range being between the third voltage and the fourth voltage, based on the second data and the third data; and
determine the first voltage, based on the number of first memory cells and the number of second memory cells.

2. The memory system of claim 1, wherein the third voltage is higher than the second voltage and is lower than the fourth voltage.

3. The memory system of claim 1, wherein
in the first tracking process, the memory controller is configured to determine, a voltage within the first voltage range as the first voltage in a case where the number of first memory cells is smaller than the number of second memory cells.

4. The memory system of claim 1, wherein
in the first tracking process, the memory controller is configured to determine, as the first voltage, a voltage within a third voltage range, the third voltage range being between a first representative voltage and a second representative voltage, the first voltage being determined based on a ratio between the number of first memory cells and the number of second memory cells, the first representative voltage being in the first voltage range, the second representative voltage being in the second voltage range.

5. The memory system of claim 4, wherein the first voltage corresponds to a point that internally divides the third voltage range by the ratio.

6. The memory system of claim 1, wherein
in the first tracking process, the memory controller is configured to:

specify a first function, based on a first representative voltage in the first voltage range, a second representative voltage in the second voltage range, the number of first memory cells, the number of second memory cells and a first value; and determine a voltage corresponding to a minimum point of the specified first function as the first voltage.

7. The memory system of claim 6, wherein the first function is a quadratic function including the first value as a positive quadratic coefficient, minimizes a difference between an output corresponding to an input of the first representative voltage and the number of first memory cells, and minimizes a difference between an output corresponding to an input of the second representative voltage and the number of second memory cells.

8. The memory system of claim 6, wherein the first value is a fixed value.

9. The memory system of claim 6, wherein the semiconductor memory includes a memory cell array that includes the plurality of memory cells, wherein the first value varies in accordance with at least one of:

an elapsed time from write of data to be read by the read process to the memory cell array;

a number of times data is written to the memory cell array;

a number of times data is erased from the memory cell array; and a word line to which the plurality of memory cells are coupled.

10. The memory system of claim 6, wherein the memory controller is further configured to perform an update process to update the first value, and in the update process, the memory controller is configured to:

further read fourth data from the memory cells using a fifth voltage;

determine a number of third memory cells included among the plurality of memory cells, the third memory cells each having a threshold voltage in a third voltage range, the third voltage range being between the second voltage or the fourth voltage and the fifth voltage, based on either (A) the first data and the fourth data, or (B) the third data and the fourth data;

specify a second function, based on the first representative voltage, the second representative voltage, a third representative voltage in the third voltage range, the number of first memory cells, the number of second memory cells and the number of third memory cells; and update the first value to a second value indicative of a quadratic coefficient of the specified second function.

11. The memory system of claim 10, wherein the memory controller is configured to execute the update process when an error correction process for data which is read from the plurality of memory cells using the first voltage fails.

12. The memory system of claim 10, wherein the second function is a quadratic function including the second value as a positive quadratic coefficient, minimizes a difference between an output corresponding to an input of the first representative voltage and the number of first memory cells, minimizes a difference between an output corresponding to an input of the second representative voltage and the number of second memory cells, and minimizes a difference between an output corresponding to an input of the third representative voltage and the number of third memory cells.

13. The memory system of claim 10, wherein the memory controller is configured to execute the update process after data read by the read process is transmitted to a host device.

14. The memory system of claim 10, wherein the memory controller is configured to execute the update process before receiving a subsequent read request for the plurality of memory cells from a host device.

15. The memory system of claim 1, wherein the memory controller is configured to:

execute a second tracking process for determining a sixth voltage, when an error correction process for data which is read from the plurality of memory cells using the first voltage fails; and execute an additional read process after the first tracking process and the second tracking process;

in the second tracking process, the memory controller is configured to:

further read fourth data from the plurality of memory cells using a fifth voltage;

determine a number of third memory cells included among the plurality of memory cells, the third memory cells each having a threshold voltage in a third voltage range, the third voltage range being between the second voltage or the fourth voltage and the fifth voltage, based on either (A) the first data and the fourth data, or (B) the third data and the fourth data; and determine the sixth voltage, based on the number of first memory cells, the number of second memory cells, and the number of third memory cells.

16. The memory system of claim 15, wherein in the first tracking process, the memory controller is configured to:

specify a first function, based on a first representative voltage in the first voltage range, a second representative voltage in the second voltage range, the number of first memory cells, the number of second memory cells and a first value; and determine a voltage corresponding to a minimum point of the specified first function, as the first voltage.

17. The memory system of claim 16, wherein the memory controller is further configured to perform an update process that updates the first value;

in the update process, the memory controller is configured to:

specify a second function, based on the first representative voltage, the second representative voltage, a third representative voltage in the third voltage range, the number of first memory cells, the number of second memory cells and the number of third memory cells; and update the first value to a second value indicative of a quadratic coefficient of the specified second function.

18. The memory system of claim 17, wherein the memory controller is configured to execute the update process when an error correction process for data which is read from the plurality of memory cells using the first voltage fails.

19. The memory system of claim 17, wherein the memory controller is configured to execute the update process after data read by the read process is transmitted to a host device.

20. The memory system according to claim 17, wherein the memory controller is configured to execute the update before receiving a subsequent read request for the plurality of memory cells from a host device.

\* \* \* \* \*